US009659769B1

(12) United States Patent
Varadarajan et al.

(10) Patent No.: US 9,659,769 B1
(45) Date of Patent: May 23, 2017

(54) TENSILE DIELECTRIC FILMS USING UV CURING

(75) Inventors: Bhadri Varadarajan, Beaverton, OR (US); Sean Chang, Sunnyvale, CA (US); James S. Sims, Tigard, OR (US); Guangquan Lu, Fremont, CA (US); David Mordo, Cupertino, CA (US); Kevin Ilcisin, Beaverton, OR (US); Mandar Pandit, Wilsonville, OR (US); Michael Carris, Tigard, OR (US)

(73) Assignee: Novellus Systems, Inc., Fremont, CA (US)

( * ) Notice: Subject to any disclaimer, the term of this patent is extended or adjusted under 35 U.S.C. 154(b) by 2976 days.

(21) Appl. No.: 10/972,084

(22) Filed: Oct. 22, 2004

(51) Int. Cl.
*H01L 21/31* (2006.01)
*H01L 21/02* (2006.01)
*H01L 21/3105* (2006.01)
*H01L 21/477* (2006.01)
*H01L 21/26* (2006.01)

(52) U.S. Cl.
CPC ........ *H01L 21/02348* (2013.01); *H01L 21/26* (2013.01); *H01L 21/3105* (2013.01); *H01L 21/477* (2013.01)

(58) Field of Classification Search
CPC ........... H01L 21/02348; H01L 21/3105; H01L 21/477; H01L 21/26
USPC ....................................................... 430/328
See application file for complete search history.

(56) References Cited

U.S. PATENT DOCUMENTS

| | | |
|---|---|---|
| 3,704,219 A | 11/1972 | McDowell |
| 3,983,385 A | 9/1976 | Troue |
| 4,313,969 A | 2/1982 | Matthews et al. |
| 4,357,451 A | 11/1982 | McDaniel |
| 4,391,663 A | 7/1983 | Hutter, III |
| 4,563,589 A | 1/1986 | Scheffer |
| 4,751,191 A | 6/1988 | Gonslorawski et al. |
| 4,837,289 A | 6/1989 | Mueller et al. |
| 4,882,008 A | 11/1989 | Garza et al. |
| 4,885,262 A | 12/1989 | Ting et al. |
| 4,927,786 A | 5/1990 | Nishida |
| 4,956,582 A | 9/1990 | Bourassa |
| 5,028,560 A | 7/1991 | Tsukamoto et al. |
| 5,174,881 A | 12/1992 | Iwasaki et al. |
| 5,178,682 A | 1/1993 | Tsukamoto et al. |
| 5,195,045 A | 3/1993 | Keane et al. |
| 5,249,076 A | 9/1993 | Fujiwara et al. |
| 5,268,320 A | 12/1993 | Holler et al. |
| 5,282,121 A | 1/1994 | Bornhorst et al. |
| 5,288,684 A | 2/1994 | Yamazaki et al. |
| 5,298,939 A | 3/1994 | Swanson et al. |
| 5,300,331 A | 4/1994 | Schaeffer |
| 5,314,538 A | 5/1994 | Maeda et al. |
| 5,364,667 A | 11/1994 | Rhieu |
| 5,407,524 A | 4/1995 | Patrick et al. |
| 5,413,664 A | 5/1995 | Yagi et al. |
| 5,504,042 A | 4/1996 | Cho et al. |
| 5,552,927 A | 9/1996 | Wheatly et al. |
| 5,556,549 A | 9/1996 | Patrick et al. |
| 5,558,717 A | 9/1996 | Zhao et al. |
| 5,582,880 A | 12/1996 | Mochizuki et al. |
| 5,667,592 A | 9/1997 | Boitnott et al. |
| 5,686,054 A | 11/1997 | Barthel et al. |
| 5,700,844 A | 12/1997 | Hedrick et al. |
| 5,734,187 A | 3/1998 | Bohr et al. |
| 5,789,027 A | 8/1998 | Watkins et al. |
| 5,812,403 A | 9/1998 | Fong et al. |
| 5,840,600 A | 11/1998 | Yamazaki et al. |
| 5,849,640 A | 12/1998 | Hsia et al. |
| 5,851,715 A | 12/1998 | Barthel et al. |
| 5,858,457 A | 1/1999 | Brinker et al. |
| 5,876,798 A | 3/1999 | Vassiliev |
| 5,877,095 A | 3/1999 | Tamura et al. |
| 5,920,790 A | 7/1999 | Wetzel et al. |
| 6,015,503 A | 1/2000 | Butterbaugh et al. |
| 6,090,442 A | 7/2000 | Klaus et al. |
| 6,098,637 A | 8/2000 | Parke |

(Continued)

FOREIGN PATENT DOCUMENTS

| | | |
|---|---|---|
| CN | 1531749 A | 9/2004 |
| CN | 1624895 | 6/2005 |

(Continued)

OTHER PUBLICATIONS

Schravendijk, et al., "UV Treatment of STI Films for Stress," Novellus Systems, Inc., U.S. Appl. No. 11/811,048, filed Jun. 7, 2007.

Arghavani et al., Strain Engineering in Non-Volatile Memories, *Reed Business Information*, 2007, six pages.

Notice of Allowance and Fee Due mailed May 22, 2006, from U.S. Appl. No. 10/672,311.

Allowed Claims from U.S. Appl. No. 10/672,311.

Notice of Allowance and Fee Due mailed Apr. 4, 2007, from U.S. Appl. No. 10/825,888.

(Continued)

*Primary Examiner* — Daborah Chacko Davis
(74) *Attorney, Agent, or Firm* — Weaver Austin Villeneuve & Sampson LLP

(57) ABSTRACT

A highly tensile dielectric layer is generated on a heat sensitive substrate while not exceeding thermal budget constraints. Ultraviolet (UV) irradiation is used to produce highly tensile films to be used, for example, in strained NMOS transistor architectures. UV curing of as-deposited PECVD silicon nitride films, for example, has been shown to produce films with stresses of at least 1.65 E10 dynes/$cm^2$. Other dielectric capping layer film materials show similar results. In transistor implementations, the stress from a source/drain region capping layer composed of such a film is uniaxially transferred to the NMOS channel through the source-drain regions to create tensile strain in the NMOS channel.

35 Claims, 7 Drawing Sheets

(56) References Cited

U.S. PATENT DOCUMENTS

| | | | |
|---|---|---|---|
| 6,132,814 A | 10/2000 | Livesay et al. |
| 6,136,680 A | 10/2000 | Lai et al. |
| 6,140,252 A | 10/2000 | Cho et al. |
| 6,149,828 A | 11/2000 | Vaartstra |
| 6,150,272 A | 11/2000 | Liu et al. |
| 6,171,661 B1 | 1/2001 | Zheng et al. |
| 6,177,329 B1 | 1/2001 | Pang |
| 6,228,563 B1 | 5/2001 | Starov et al. |
| 6,232,248 B1 | 5/2001 | Shinriki et al. |
| 6,232,658 B1 | 5/2001 | Catabay et al. |
| 6,239,018 B1 | 5/2001 | Liu et al. |
| 6,254,689 B1 | 7/2001 | Meder |
| 6,258,735 B1 | 7/2001 | Xia et al. |
| 6,268,276 B1 | 7/2001 | Chan et al. |
| 6,268,288 B1 | 7/2001 | Hautala et al. |
| 6,270,846 B1 | 8/2001 | Brinker et al. |
| 6,271,273 B1 | 8/2001 | You et al. |
| 6,280,171 B1 | 8/2001 | Buazza |
| 6,284,050 B1 | 9/2001 | Shi et al. |
| 6,288,493 B1 | 9/2001 | Lee et al. |
| 6,290,589 B1 | 9/2001 | Tolles |
| 6,306,564 B1 | 10/2001 | Mullee |
| 6,312,793 B1 | 11/2001 | Grill et al. |
| 6,329,017 B1 | 12/2001 | Liu et al. |
| 6,329,062 B1 | 12/2001 | Gaynor |
| 6,331,480 B1 | 12/2001 | Tsai et al. |
| 6,333,268 B1 | 12/2001 | Starov et al. |
| 6,340,628 B1 | 1/2002 | Van Cleemput et al. |
| 6,348,407 B1 | 2/2002 | Gupta et al. |
| 6,365,266 B1 | 4/2002 | MacDougall et al. |
| 6,367,412 B1 | 4/2002 | Ramaswarry et al. |
| 6,383,466 B1 | 5/2002 | Domansky et al. |
| 6,383,955 B1 | 5/2002 | Matsuki et al. |
| 6,386,466 B1 | 5/2002 | Ozawa et al. |
| 6,387,453 B1 | 5/2002 | Brinker et al. |
| 6,391,932 B1 | 5/2002 | Gore et al. |
| 6,392,017 B1 | 5/2002 | Chandrashekar |
| 6,394,797 B1 | 5/2002 | Sugaya et al. |
| 6,399,212 B1 | 6/2002 | Sakai et al. |
| 6,407,007 B1 | 6/2002 | Tsan et al. |
| 6,420,441 B1 | 7/2002 | Allen et al. |
| 6,444,715 B1 | 9/2002 | Mukherjee et al. |
| 6,455,417 B1 | 9/2002 | Bao et al. |
| 6,467,491 B1 | 10/2002 | Sugiura et al. |
| 6,475,854 B2 | 11/2002 | Narwankar et al. |
| 6,479,374 B1 | 11/2002 | Ioka et al. |
| 6,479,409 B2 | 11/2002 | Shioya et al. |
| 6,485,599 B1 | 11/2002 | Glownia et al. |
| 6,500,770 B1 | 12/2002 | Cheng et al. |
| 6,518,130 B1 * | 2/2003 | Ohno | 438/275 |
| 6,531,193 B2 | 3/2003 | Fonash et al. |
| 6,534,395 B2 | 3/2003 | Werkhoven et al. |
| 6,548,113 B1 | 4/2003 | Birnbaum et al. |
| 6,558,755 B2 | 5/2003 | Berry et al. |
| 6,563,092 B1 | 5/2003 | Shrinivasan et al. |
| 6,566,278 B1 | 5/2003 | Harvey et al. |
| 6,568,346 B2 | 5/2003 | Pu et al. |
| 6,572,252 B1 | 6/2003 | Rangarajan et al. |
| 6,573,030 B1 | 6/2003 | Fairbairn et al. |
| 6,576,300 B1 | 6/2003 | Berry et al. |
| 6,576,345 B1 | 6/2003 | Van Cleemput et al. |
| 6,596,467 B2 | 7/2003 | Gallagher et al. |
| 6,596,654 B1 | 7/2003 | Bayman et al. |
| 6,610,362 B1 | 8/2003 | Towle |
| 6,632,478 B2 | 10/2003 | Gaillard et al. |
| 6,635,575 B1 | 10/2003 | Xia et al. |
| 6,644,786 B1 | 11/2003 | Lebens |
| 6,667,147 B2 | 12/2003 | Gallagher et al. |
| 6,677,251 B1 | 1/2004 | Lu et al. |
| 6,715,498 B1 | 4/2004 | Humayun et al. |
| 6,740,602 B1 | 5/2004 | Hendriks et al. |
| 6,740,605 B1 | 5/2004 | Shiraiwa et al. |
| 6,756,085 B2 | 6/2004 | Waldfried et al. |
| 6,759,098 B2 | 7/2004 | Han et al. |
| 6,770,866 B2 | 8/2004 | Retschke et al. |
| 6,797,643 B2 | 9/2004 | Rocha-Alvarez et al. |
| 6,800,546 B2 | 10/2004 | Konishi et al. |
| 6,805,801 B1 | 10/2004 | Humayun et al. |
| 6,812,043 B2 | 11/2004 | Bao et al. |
| 6,815,373 B2 | 11/2004 | Singh et al. |
| 6,821,906 B2 | 11/2004 | Wada et al. |
| 6,830,624 B2 | 12/2004 | Janakiraman et al. |
| 6,831,284 B2 | 12/2004 | Demos et al. |
| 6,835,417 B2 | 12/2004 | Saenger et al. |
| 6,846,380 B2 | 1/2005 | Dickinson et al. |
| 6,848,458 B1 | 2/2005 | Shrinivasan et al. |
| 6,849,549 B1 | 2/2005 | Chiou et al. |
| 6,856,712 B2 | 2/2005 | Fauver et al. |
| 6,867,086 B1 | 3/2005 | Chen et al. |
| 6,884,738 B2 | 4/2005 | Asai et al. |
| 6,899,857 B2 | 5/2005 | Pheng et al. |
| 6,902,440 B2 | 6/2005 | Dougan et al. |
| 6,903,004 B1 | 6/2005 | Spencer et al. |
| 6,914,014 B2 | 7/2005 | Li et al. |
| 6,921,727 B2 | 7/2005 | Chiang et al. |
| 6,943,121 B2 | 9/2005 | Leu et al. |
| 6,958,301 B2 | 10/2005 | Kim et al. |
| 6,962,871 B2 | 11/2005 | Lee et al. |
| 6,967,160 B1 * | 11/2005 | Paton et al. | 438/664 |
| 7,005,390 B2 | 2/2006 | Ramachandrarao et al. |
| 7,017,514 B1 | 3/2006 | Shepherd et al. |
| 7,018,918 B2 | 3/2006 | Kloster et al. |
| 7,025,831 B1 | 4/2006 | Butterbaugh et al. |
| 7,030,041 B2 | 4/2006 | Li et al. |
| 7,087,271 B2 | 8/2006 | Rhee et al. |
| 7,094,713 B1 | 8/2006 | Niu et al. |
| 7,097,712 B1 | 8/2006 | Yamazaki et al. |
| 7,112,541 B2 | 9/2006 | Xia et al. |
| 7,132,334 B2 * | 11/2006 | Lin | 438/275 |
| 7,144,606 B2 | 12/2006 | Huang |
| 7,148,155 B1 | 12/2006 | Tarafdar et al. |
| 7,166,531 B1 | 1/2007 | van den Hoek et al. |
| 7,169,256 B2 | 1/2007 | Dhindsa et al. |
| 7,176,144 B1 | 2/2007 | Wang et al. |
| 7,195,548 B1 | 3/2007 | Hardikar et al. |
| 7,208,389 B1 | 4/2007 | Tipton et al. |
| 7,235,459 B2 | 6/2007 | Sandhu |
| 7,241,704 B1 | 7/2007 | Wu et al. |
| 7,244,672 B2 | 7/2007 | Nguyen et al. |
| 7,247,582 B2 | 7/2007 | Stern et al. |
| 7,253,125 B1 | 8/2007 | Bandyopadhyay et al. |
| 7,256,111 B2 | 8/2007 | Lopatin et al. |
| 7,264,676 B2 | 9/2007 | Lai et al. |
| 7,265,061 B1 | 9/2007 | Cho et al. |
| 7,304,302 B1 | 12/2007 | Nunan et al. |
| 7,327,948 B1 | 2/2008 | Shrinivasan et al. |
| 7,332,445 B2 | 2/2008 | Lukas et al. |
| 7,381,659 B2 | 6/2008 | Nguyen et al. |
| 7,390,537 B1 | 6/2008 | Wu et al. |
| 7,394,067 B1 | 7/2008 | Soltz et al. |
| 7,402,532 B2 | 7/2008 | Clevenger et al. |
| 7,481,882 B2 | 1/2009 | Won et al. |
| 7,482,265 B2 | 1/2009 | Chen et al. |
| 7,504,663 B2 | 3/2009 | Yamazaki et al. |
| 7,510,982 B1 | 3/2009 | Draeger et al. |
| 7,538,012 B2 | 5/2009 | Ohmi et al. |
| 7,611,757 B1 | 11/2009 | Bandyopadhyay et al. |
| 7,622,162 B1 | 11/2009 | van Schravendijk et al. |
| 7,705,431 B1 | 4/2010 | Sanganeria et al. |
| 7,790,633 B1 | 9/2010 | Tarafdar et al. |
| 7,851,232 B2 | 12/2010 | van Schravendijk et al. |
| 7,858,533 B2 | 12/2010 | Liu et al. |
| 7,906,174 B1 | 3/2011 | Wu et al. |
| 8,043,667 B1 | 10/2011 | Bandyopadhyay et al. |
| 8,062,983 B1 | 11/2011 | Draeger et al. |
| 8,063,983 B2 | 11/2011 | Kotake et al. |
| 8,137,465 B1 | 3/2012 | Shrinivasan et al. |
| 8,211,510 B1 | 7/2012 | Varadarajan et al. |
| 8,242,028 B1 | 8/2012 | Van Schravendijk et al. |
| 8,454,750 B1 | 6/2013 | Shrinivasan et al. |
| 8,465,991 B2 | 6/2013 | Varadarajan et al. |
| 8,512,818 B1 | 8/2013 | Varadarajan et al. |
| 8,629,068 B1 | 1/2014 | Shrinivasan et al. |
| 8,715,788 B1 | 5/2014 | Bandyopadhyay et al. |

(56) References Cited

U.S. PATENT DOCUMENTS

| | | | |
|---|---|---|---|
| 8,889,233 B1 | 11/2014 | Kelman et al. | |
| 8,980,769 B1 | 3/2015 | Haverkamp et al. | |
| 9,050,623 B1 | 6/2015 | Varadarajan | |
| 2001/0001501 A1* | 5/2001 | Lee et al. | 257/534 |
| 2001/0014512 A1 | 8/2001 | Lyons et al. | |
| 2002/0001973 A1 | 1/2002 | Wu et al. | |
| 2002/0015850 A1 | 2/2002 | Nakamura et al. | |
| 2002/0016085 A1 | 2/2002 | Huang et al. | |
| 2002/0034626 A1 | 3/2002 | Liu et al. | |
| 2002/0052124 A1 | 5/2002 | Raaijmakers et al. | |
| 2002/0064341 A1 | 5/2002 | Fauver et al. | |
| 2002/0106500 A1 | 8/2002 | Albano et al. | |
| 2002/0117109 A1 | 8/2002 | Hazelton et al. | |
| 2002/0123218 A1 | 9/2002 | Shioya et al. | |
| 2002/0123240 A1 | 9/2002 | Gallagher et al. | |
| 2002/0141024 A1 | 10/2002 | Retschke et al. | |
| 2002/0148563 A1 | 10/2002 | Carlson et al. | |
| 2002/0172766 A1 | 11/2002 | Laxman et al. | |
| 2002/0187627 A1 | 12/2002 | Yuang | |
| 2002/0192980 A1 | 12/2002 | Hogle et al. | |
| 2002/0195683 A1 | 12/2002 | Kim et al. | |
| 2003/0013280 A1 | 1/2003 | Yamanaka | |
| 2003/0015764 A1 | 1/2003 | Raaijmakers et al. | |
| 2003/0064604 A1 | 4/2003 | Umeda | |
| 2003/0064607 A1 | 4/2003 | Leu et al. | |
| 2003/0066544 A1 | 4/2003 | Jur et al. | |
| 2003/0068881 A1 | 4/2003 | Xia et al. | |
| 2003/0119307 A1 | 6/2003 | Bekiaris et al. | |
| 2003/0134038 A1 | 7/2003 | Paranjpe | |
| 2003/0157248 A1 | 8/2003 | Watkins et al. | |
| 2003/0157267 A1 | 8/2003 | Waldfried et al. | |
| 2003/0198895 A1 | 10/2003 | Toma et al. | |
| 2003/0199603 A1 | 10/2003 | Walker et al. | |
| 2003/0203321 A1 | 10/2003 | Ma et al. | |
| 2003/0227087 A1 | 12/2003 | Kakamu et al. | |
| 2003/0228769 A1 | 12/2003 | Chen et al. | |
| 2003/0228770 A1 | 12/2003 | Lee et al. | |
| 2004/0002617 A1 | 1/2004 | Rantala et al. | |
| 2004/0004247 A1 | 1/2004 | Forbes et al. | |
| 2004/0018319 A1 | 1/2004 | Waldfried et al. | |
| 2004/0022960 A1 | 2/2004 | Rhee et al. | |
| 2004/0023513 A1 | 2/2004 | Aoyama et al. | |
| 2004/0029391 A1 | 2/2004 | Kirkpatrick et al. | |
| 2004/0033662 A1 | 2/2004 | Lee et al. | |
| 2004/0058090 A1 | 3/2004 | Waldfried et al. | |
| 2004/0062633 A1 | 4/2004 | Rice et al. | |
| 2004/0069410 A1 | 4/2004 | Moghadam et al. | |
| 2004/0072405 A1 | 4/2004 | Yao et al. | |
| 2004/0082163 A1 | 4/2004 | Mori et al. | |
| 2004/0096586 A1 | 5/2004 | Schulberg et al. | |
| 2004/0096593 A1 | 5/2004 | Lukas et al. | |
| 2004/0096672 A1 | 5/2004 | Lukas et al. | |
| 2004/0099915 A1 | 5/2004 | Takayama et al. | |
| 2004/0099952 A1 | 5/2004 | Goodner et al. | |
| 2004/0101633 A1 | 5/2004 | Zheng et al. | |
| 2004/0102031 A1 | 5/2004 | Kloster et al. | |
| 2004/0102032 A1 | 5/2004 | Kloster et al. | |
| 2004/0115933 A1 | 6/2004 | Jung et al. | |
| 2004/0152239 A1 | 8/2004 | Bao et al. | |
| 2004/0161532 A1 | 8/2004 | Kloster et al. | |
| 2004/0166240 A1 | 8/2004 | Rhee et al. | |
| 2004/0170760 A1 | 9/2004 | Meagley et al. | |
| 2004/0175501 A1 | 9/2004 | Lukas et al. | |
| 2004/0175957 A1 | 9/2004 | Lukas et al. | |
| 2004/0185679 A1 | 9/2004 | Ott et al. | |
| 2004/0221871 A1 | 11/2004 | Fletcher et al. | |
| 2004/0224496 A1 | 11/2004 | Cui et al. | |
| 2004/0266214 A1 | 12/2004 | Suguro et al. | |
| 2005/0016687 A1 | 1/2005 | Shinriki et al. | |
| 2005/0025892 A1 | 2/2005 | Satoh et al. | |
| 2005/0026454 A1 | 2/2005 | Konishi et al. | |
| 2005/0032293 A1 | 2/2005 | Clark et al. | |
| 2005/0056369 A1 | 3/2005 | Lai et al. | |
| 2005/0064698 A1 | 3/2005 | Chang et al. | |
| 2005/0064712 A1 | 3/2005 | Andreas | |
| 2005/0064726 A1* | 3/2005 | Reid et al. | 438/778 |
| 2005/0079717 A1 | 4/2005 | Savas et al. | |
| 2005/0095840 A1 | 5/2005 | Bhanap et al. | |
| 2005/0101154 A1 | 5/2005 | Huang | |
| 2005/0112282 A1 | 5/2005 | Gordon et al. | |
| 2005/0153533 A1 | 7/2005 | Hoshino et al. | |
| 2005/0156285 A1 | 7/2005 | Gates et al. | |
| 2005/0161821 A1 | 7/2005 | Lee et al. | |
| 2005/0164497 A1 | 7/2005 | Lopatin et al. | |
| 2005/0170104 A1 | 8/2005 | Jung et al. | |
| 2005/0191803 A1 | 9/2005 | Matsuse et al. | |
| 2005/0194619 A1 | 9/2005 | Edelstein et al. | |
| 2005/0208758 A1 | 9/2005 | Lu et al. | |
| 2005/0233598 A1 | 10/2005 | Jung et al. | |
| 2005/0255712 A1 | 11/2005 | Kato et al. | |
| 2005/0260357 A1 | 11/2005 | Olsen et al. | |
| 2005/0260420 A1 | 11/2005 | Collins et al. | |
| 2005/0263719 A1 | 12/2005 | Ohdaira et al. | |
| 2005/0264218 A1 | 12/2005 | Dhindsa et al. | |
| 2005/0272220 A1* | 12/2005 | Waldfried et al. | 438/400 |
| 2006/0024976 A1 | 2/2006 | Waldfried et al. | |
| 2006/0027929 A1 | 2/2006 | Cooney et al. | |
| 2006/0046516 A1 | 3/2006 | Weber | |
| 2006/0063662 A1 | 3/2006 | Hata et al. | |
| 2006/0105106 A1 | 5/2006 | Balseanu et al. | |
| 2006/0110931 A1 | 5/2006 | Fukazawa et al. | |
| 2006/0110936 A1 | 5/2006 | Hill et al. | |
| 2006/0118817 A1 | 6/2006 | Haisma | |
| 2006/0121208 A1 | 6/2006 | Siegel | |
| 2006/0141806 A1 | 6/2006 | Waldfried et al. | |
| 2006/0142143 A1 | 6/2006 | Abrevaya et al. | |
| 2006/0145304 A1 | 7/2006 | Boyanov et al. | |
| 2006/0189133 A1 | 8/2006 | Dimitrakopoulos et al. | |
| 2006/0197881 A1 | 9/2006 | Kang et al. | |
| 2006/0216433 A1 | 9/2006 | Fukazawa et al. | |
| 2006/0216839 A1 | 9/2006 | Shenesh et al. | |
| 2006/0220251 A1 | 10/2006 | Kloster | |
| 2006/0246672 A1 | 11/2006 | Chen et al. | |
| 2006/0260538 A1 | 11/2006 | Ye et al. | |
| 2006/0265868 A1 | 11/2006 | Rueger et al. | |
| 2006/0269693 A1 | 11/2006 | Balseanu et al. | |
| 2007/0009673 A1 | 1/2007 | Fukazawa et al. | |
| 2007/0015355 A1 | 1/2007 | Lin et al. | |
| 2007/0020940 A1 | 1/2007 | Ohmi et al. | |
| 2007/0032024 A1 | 2/2007 | Peidous et al. | |
| 2007/0042581 A1 | 2/2007 | Sano et al. | |
| 2007/0054504 A1 | 3/2007 | Chen et al. | |
| 2007/0065578 A1 | 3/2007 | McDougall | |
| 2007/0105292 A1 | 5/2007 | Chen et al. | |
| 2007/0132054 A1 | 6/2007 | Arghavani et al. | |
| 2007/0134821 A1 | 6/2007 | Thakur et al. | |
| 2007/0134907 A1 | 6/2007 | Ikeda et al. | |
| 2007/0161230 A1 | 7/2007 | Chen et al. | |
| 2007/0189961 A1 | 8/2007 | Iacopi et al. | |
| 2007/0196011 A1 | 8/2007 | Cox et al. | |
| 2007/0196972 A1 | 8/2007 | Shima | |
| 2007/0207624 A1 | 9/2007 | Chua | |
| 2007/0215377 A1 | 9/2007 | Aoki | |
| 2007/0222081 A1 | 9/2007 | Chen et al. | |
| 2007/0224824 A1 | 9/2007 | Chen et al. | |
| 2007/0228570 A1 | 10/2007 | Dimitrakopoulos et al. | |
| 2007/0254204 A1 | 11/2007 | Shin et al. | |
| 2007/0275569 A1 | 11/2007 | Moghadam et al. | |
| 2007/0281497 A1 | 12/2007 | Liu et al. | |
| 2007/0287240 A1 | 12/2007 | Chen et al. | |
| 2008/0009141 A1 | 1/2008 | Dubois et al. | |
| 2008/0020591 A1 | 1/2008 | Balseanu et al. | |
| 2008/0026579 A1 | 1/2008 | Lai et al. | |
| 2008/0053615 A1 | 3/2008 | Sago et al. | |
| 2008/0132055 A1 | 6/2008 | Nguyen et al. | |
| 2008/0199977 A1 | 8/2008 | Weigel et al. | |
| 2008/0242118 A1 | 10/2008 | Dimitrakopoulos et al. | |
| 2008/0254643 A1 | 10/2008 | Clevenger et al. | |
| 2008/0286697 A1 | 11/2008 | Verhaverbeke et al. | |
| 2008/0305600 A1 | 12/2008 | Liao et al. | |
| 2008/0318437 A1 | 12/2008 | Kim et al. | |
| 2008/0318438 A1 | 12/2008 | Nakamura et al. | |
| 2009/0017640 A1 | 1/2009 | Huh et al. | |
| 2009/0039475 A1 | 2/2009 | Shioya | |

(56) References Cited

U.S. PATENT DOCUMENTS

| | | | |
|---|---|---|---|
| 2009/0059406 A1 | 3/2009 | Powers et al. |
| 2009/0207624 A1 | 8/2009 | Ma et al. |
| 2009/0243001 A1 | 10/2009 | Ramkumar et al. |
| 2009/0269507 A1 | 10/2009 | Yu et al. |
| 2009/0278116 A1 | 11/2009 | Yamate |
| 2010/0018460 A1 | 1/2010 | Singh et al. |
| 2010/0216303 A1 | 8/2010 | Ohkura |
| 2010/0261349 A1 | 10/2010 | Van Schravendijk et al. |
| 2010/0267231 A1 | 10/2010 | Van Schravendijk et al. |
| 2010/0317198 A1 | 12/2010 | Antonelli et al. |
| 2011/0045610 A1 | 2/2011 | Van Schravendijk et al. |
| 2011/0111533 A1 | 5/2011 | Varadarajan et al. |
| 2011/0117678 A1 | 5/2011 | Varadarajan et al. |
| 2011/0236593 A1 | 9/2011 | Okino et al. |
| 2012/0061718 A1 | 3/2012 | Yamazaki et al. |
| 2014/0080324 A1 | 3/2014 | Shrinivasan et al. |
| 2014/0094038 A1 | 4/2014 | Haverkamp et al. |
| 2015/0114292 A1 | 4/2015 | Haverkamp et al. |
| 2016/0138160 A1 | 5/2016 | Lambert et al. |

FOREIGN PATENT DOCUMENTS

| | | |
|---|---|---|
| CN | 101005023 A | 7/2007 |
| CN | 102074500 | 5/2011 |
| JP | 62-229833 | 10/1987 |
| JP | 01-107519 | 4/1989 |
| JP | 05-031735 A | 2/1993 |
| JP | 05-138658 A | 6/1993 |
| JP | 09-306892 | 11/1997 |
| JP | 11214364 A | 8/1999 |
| JP | 2001-104776 A | 4/2001 |
| JP | 2006165573 | 6/2006 |
| JP | 2007-508691 | 4/2007 |
| JP | 2007-194582 A | 8/2007 |
| JP | 63-307740 | 12/2008 |
| JP | 2010-103151 | 6/2010 |
| KR | 2000-0043888 | 7/2000 |
| KR | 10-1201039 | 11/2012 |
| TW | 201130045 | 9/2011 |
| TW | 201237959 | 9/2012 |
| WO | WO95/07543 | 3/1995 |
| WO | 2006/104583 | 10/2006 |
| WO | 2006/127463 | 11/2006 |
| WO | 2007/043206 | 4/2007 |
| WO | WO 2008/156608 | 12/2008 |
| WO | 2012/087620 | 6/2012 |

OTHER PUBLICATIONS

Allowed Claims from U.S. Appl. No. 10/825,888.

Bandyopadhyay et al., "Method to Improve Mechanical Strength of Low-K Dielectric Film Using Modulated UV Exposure," Novellus Systems, Inc., U.S. Appl. No. 11/824,049, filed Jun. 28, 2007.

Notice of Allowance and Fee Due mailed Oct. 10, 2006, from U.S. Appl. No. 10/800,377.

Allowed Claims from U.S. Appl. No. 10/800,377.

U.S. Office Action mailed Nov. 28, 2007, from U.S. Appl. No. 10/807,680.

R.J. Lewis, Sr., Hawley's Condensed Chemical Dictionary, 12$^{th}$ Edition, Van Nostrad Reinhold Co., New York, 1993 (no month), excerpts pp. 916-918 & 1123-1124.

Notice of Allowance and Fee Due mailed Dec. 20, 2005, from U.S. Appl. No. 10/860,340.

Allowed Claims from U.S. Appl. No. 10/860,340.

U.S. Office Action mailed Oct. 3, 2007, from U.S. Appl. No. 11/115,576.

Shaviv et al., "UV Treatment to Improve Integrity and Performance of Front End Dielectrics," Novellus Systems, Inc., U.S. Appl. No. 11/622,409, filed Jan. 11, 2007.

van Schravendijk et al., "UV Treatment for Carbon-Containing Low-K Dielectric Repair in Semiconductor Processing," Novellus Systems, Inc., U.S. Appl. No. 11/590,661, filed Oct. 30, 2006.

Shrinivassan et al., "Multi-Station Sequential Curing of Dielectric Films," Novellus Systems, Inc., U.S. Appl. No. 11/688,695, filed Mar. 20, 2007.

Varadarajan et al., "A Cascaded Cure Approach to Fabricate Highly Tensile Silicon Nitride Films," Novellus Systems, Inc., U.S. Appl. No. 11/897,838, filed Aug. 31, 2007.

Van den Hoek, et al., "VLSI Fabrication Processes for Introducing Pores Into Dielectric Materials," Novellus Systems, Inc., U.S. Appl. No. 11/606,340, filed Nov. 28, 2006.

U.S. Office Action mailed Jan. 10, 2008, from U.S. Appl. No. 11/622,423.

Bhadri Varadarajan et al., "Development of High Stress SiN Films for Use with Strained Silicon Technologies"; Proc. 68$^{th}$ Symp. On Semiconductors and IC Tech.; Kyoto 2005.

U.S. Office Action mailed Dec. 27, 2005, from U.S. Appl. No. 10/789,103.

U.S. Office Action mailed Dec. 23, 2005, from U.S. Appl. No. 10/800,409.

U.S. Office Action mailed Feb. 7, 2006, from U.S. Appl. No. 10/672,305.

U.S. Office Action mailed Dec. 20, 2005, from U.S. Appl. No. 10/672,311.

U.S. Office Action mailed Dec. 20, 2005, from U.S. Appl. No. 10/849,568.

U.S. Office Action mailed Jan. 9, 2006, from U.S. Appl. No. 10/785,235.

Peter Singer, "New Materials and Designs to Improve Transistor Performance", Apr. 1, 2004, Semiconductor International.

Ghani et al, "A 90nm High Volume Manufacturing Logic Technology Featuring Novel 45nm Gate Length Strained Silicon CMOS Transistors", IEEE, © 2003.

Bhadri N. Varadarajan, "Tensile Silicon Nitride—P1264 NESL", C & F Study, Aug. 21, 2003.

Varadarajan, et al., "Strained Transistor Architecture and Method", Novellus Systems, Inc., U.S. Appl. No. 10/923,259, filed Aug. 20, 2004, pp. 1-24.

Tipton et al., "Method of Porogen Removal From Porous Low-K Films Using UV Radiation", Novellus Systems, Inc., U.S. Appl. No. 10/672,311, filed Sep. 26, 2003, pp. 1-27.

Subramonium et al., "Pulsed PECVD Method for Modulating Hydrogen Content in Hard Mask", U.S. Appl. No. 11/318,269, filed Dec. 23, 2005.

U.S. Office Action mailed Feb. 28, 2006, from U.S. Appl. No. 10/404,693.

U.S. Office Action mailed Mar. 29, 2006, from U.S. Appl. No. 10/800,377.

U.S. Office Action mailed Dec. 27, 2006, from U.S. Appl. No. 10/825,888.

Cho et al., "Method and Apparatus for UV Exposure of Low Dielectric Constant Materials for Porogen Removal and Improved Mechanical Properties", Novellus Systems, Inc., U.S. Appl. No. 11/656,661, filed Jan. 22, 2007, pp. 1-28.

Shrinivasan et al., "Single-Chamber Sequential Curing of Semiconductor Wafers," Novellus Systems, Inc., U.S. Appl. No. 11/115,576, filed Apr. 26, 2005, pp. 129.

Kamian et al., "Ultra Violet Light Treatment Load Lock for Dielectric Films," Novellus Systems, Inc., U.S. Appl. No. 11/561,834, filed Nov. 20, 2006, pp. 1-25.

Schravendijk et al., "UV Treatment of Etch Stop and Hard Mask Films for Selectivity and Hermeticity Enhancement," Novellus Systems, Inc., U.S. Appl. No. 11/696,102, filed Apr. 3, 2007, pp. 1-22.

Vancouver et al., "PECVD Methods for Producing Ultra Low-K Dielectric Films Using UV Treatment," U.S. Appl. No. 11/608,056, filed Dec. 7, 2006, pp. 1-34.

Tarafdar et al., "Sequential Deposition/Anneal Film Densification Method", Novellus Systems, Inc., filed Sep. 11, 2006, U.S. Appl. No. 11/519,445, pp. 1-37.

Schravendijk, "UV Treatment of FSG Films to Improve Film Stability," Novellus Systems, Inc., U.S. Appl. No. 11/622,423, filed Jan. 11, 2007, pp. 1-31.

(56) References Cited

OTHER PUBLICATIONS

Cho et al., "Plasma Treatments of Molecularly Templated Nanoporous Silica Films," Electrochemical and Solid-State Letters, 4 (4) G35-G38 (2001).

Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.

Schulberg et al., "System for Deposition of Mesoporous Materials," U.S. Appl. No. 10/295,965, filed Nov. 15, 2002, 64 Pages.

Watkins et al., "Mesoporous Materials and Methods," U.S. Appl. No. 10/301,013, filed Nov. 21, 2002, 34 Pages.

Justin F. Gaynor, "In-Situ Treatment of Low-K Films With a Silylating Agent After Exposure to Oxidizing Environments," U.S. Appl. No. 10/056,926 filed Jan. 24, 2002, 34 Pages.

Humayun et al., "Method for Forming Porous Films by Porogen Removel Combined Wtih In Situ Surface Modification", Novellus Corporation, U.S. Appl. No. 10/404,693, filed Mar. 31, 2003, pp. 1-32.

Jan, C.H., et al, *90NM Generation, 300mm Wafer Low k ILD/CU Interconnect Technology*, 2003 IEEE Interconnect Technology Conference.

Wu et al., U.S. Appl. No. 10/789,103, entitled: Methods for Producing Low-K CDO Films With Low Residual Stress.

Wu et al., U.S. Appl. No. 10/820,525, entitled: Methods for Producing Low-K CDO Films With Low Residual Stress.

Wu et al., U.S. Appl. No. 10/800,409, entitled: Methods for Producing Low-K CDO Films.

U.S. Appl. No. 10/016,017, filed Dec. 12, 2001.

U.S. Appl. No. 10/125,614, filed Apr. 18, 2002.

U.S. Appl. No. 10/202,987, filed Jul. 23, 2002.

Tipton et al., "Method for Removal of Porogens From Porous Low-K Films Using Supercritical Fluids", Novellus Systems, Inc., U.S. Appl. No. 10/672,305, filed Sep. 26, 2003, pp. 1-32.

Cho et al., "Method and Apparatus for UV Exposure of Low Dielectric Constant Materials for Porogen Removal and Improved Mechanical Properties", Novellus Systems, Inc., U.S. Appl. No. 10/800,377, filed Mar. 11, 2004, pp. 1-31.

Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.

Humayun et al., "Method for Forming Porous Films by Porogen Removal Combined With In Situ Modification", U.S. Appl. No. 10/404,693, filed Mar. 31, 2003, Office Action dated Mar. 15, 2005.

Tipton et al., "Method of Porogen Removal From Porous Low-K Films Using UV Radiation", U.S. Appl. No. 10/672,311, filed Sep. 26, 2003, Office Action dated Sep. 7, 2004.

Tipton et al., "Method of Porogen Removal From Porous Low-K Films Using UV Radiation", U.S. Appl. No. 10/672,311, filed Sep. 26, 2003, Office Action dated Dec. 28, 2004.

Tipton et al., "Method for Removal of Porogens From Porous Low-K Films Using Supercritical Fluids", U.S. Appl. No. 10/672,305, Office Action dated Mar. 22, 2005.

Bandyopadhyay et al., "Method to Improve Mechanical Strength of Low-K Dielectric Film Using Modulated UV Exposure", U.S. Appl. No. 10/825,888, filed Apr. 16, 2004.

R.D. Miller et al., "Phase-Separated Inorganic-Organic Hybrids for Microelectronic Applications," MRS Bulletin, Oct. 1997, pp. 44-48.

Jin et al., "Nanoporous Silica as an Ultralow-k Dielectric," MRS Bulletin, Oct. 1997, pp. 39-42.

Asoh et al., "Fabrication of Ideally Ordered Anodic Porous Alumina with 63 nm Hole Periodocity Using Sulfuric Acid," J. Vac. Sci. Technol. B 19(2), Mar./Apr. 2001, pp. 569-572.

Asoh et al., "Conditions for Fabrication of Ideally Ordered Anodic Porous Alumina Using Pretextured AI," Journal of the Electrochemica Society, 148 (4) B152-B156 (2001) pp. B152-B156.

Holland et al., "Nonlithographic Technique for the Production of Large Area High Density Gridded Field Sources," J. Vac. Sci. Technol. B 17(2), Mar./Apr. 1999, pp. 580-582.

Masuda et al. "Highly Ordered Nanochannel-Array Architecture in Anodic Alumina," App. Phys. Lett. 71(19), Nov. 1997, pp. 2770-2772.

Clube et al., White Paper from Holotronic Technologies SA; downloaded from www.hdotronic.com/whitepaper/fine-patt.pdf on Mar. 12, 2002.

Meli et al., "Self-Assembled Masks for the Transfer of Nanometer-Scale Patterns into Surfaces: Characterization by AFM and LFM", Nano Letters, vol. 2, No. 2, 2002, 131-135.

"Shipley Claims Porous Low K Dielectric Breakthrough," Press Release Mar. 17, 2003.

Jeffrey M. Calvert and Michael K. Gallagher, Semiconductor International, 26 (12), 56 (2003).

Van Bavel et al., Future Fab International, 16, (2004).

Caluwaerts et al, "Post Patterning Meso Porosity Creation: A Potential Solution for Pore Sealing," IITC 2003.

Niu et al., "Methods for Improving the Cracking Resistance of Low-K Dielectric Materials", U.S. Appl. No. 10/860,340, filed Jun. 2, 2004.

Niu et al., "Methods for Improving the Cracking Resistance of Low-K Dielectric Materials", U.S. Appl. No. 10/860,340, Office Action dated Mar. 2, 2005.

Niu et al., "Methods for Improving the Cracking Resistance of Low-K Dielectric Materials", U.S. Appl. No. 10/860,340, Final Office Action dated Jun. 13, 2005.

Wang et al., "Plasma Detemplating and Silanol Capping of Porous Dielectric Films", U.S. Appl. No. 10/785,235, filed Feb. 23, 2004.

Fox et al., "Method for Improving Mechanical Properties of Low Dielectric Constant Materials", U.S. Appl. No. 10/849,568, filed May 18, 2004.

Fox et al., "Methods for Producing Low-Stress Carbon-Doped Oxide Films With Improved Integration Properties", U.S. Appl. No. 10/987,208, filed Nov. 12, 2004.

Van Den Hoek et al., "VLSI Fabrication Processes for Introducing Pores Into Dielectric Materials," U.S. Appl. No. 11/050,621, filed Jan. 31, 2005.

Draeger et al., "Creation of Porosity in Low-K Films by Photo-Disassociation of Imbedded Nanoparticles," U.S. Appl. No. 11/146,456, filed Jun. 6, 2005.

Wu et al., "Methods for Producing Low Stress Porous Low-K Dielectric Materials Using Precursors With Organic Functional Groups", U.S. Appl. No. 10/927,777, filed Aug. 27, 2004.

Wu et al., "Methods for Improving Integration Performance of Low Stress CDO Films", U.S. Appl. No. 10/941,502, filed Sep. 14, 2004.

Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.

U.S. Office Action mailed May 31, 2006, from U.S. Appl. No. 10/941,502.

U.S. Office Action mailed May 30, 2006, from U.S. Appl. No. 10/785,235.

U.S. Office Action mailed May 31, 2006, from U.S. Appl. No. 10/849,568.

U.S. Office Action mailed May 2, 2006, from U.S. Appl. No. 11/050,621.

U.S. Office Action mailed Jun. 15, 2006, from U.S. Appl. No. 10/800,409.

Kelman et al., "Method for Reducing Stress in Porous Dielectric Films", U.S. Appl. No. 11/369,311, filed Mar. 6, 2006.

U.S. Office Action mailed Jun. 28, 2006, from U.S. Appl. No. 10/825,888.

U.S. Office Action mailed May 2, 2006, from U.S. Appl. No. 10/295,965.

U.S. Office Action mailed Aug. 9, 2005, from U.S. Appl. No. 10/295,965.

U.S. Office Action mailed Jun. 14, 2006, from U.S. Appl. No. 10/789,103.

U.S. Office Action mailed Jul. 13, 2005, from U.S. Appl. No. 10/672,311.

U.S. Office Action mailed Jul. 27, 2005, from U.S. Appl. No. 10/785,235.

(56) References Cited

OTHER PUBLICATIONS

U.S. Office Action mailed Aug. 24, 2005, from U.S. Appl. No. 10/404,693.
U.S. Office Action mailed Sep. 1, 2005, from U.S. Appl. No. 10/672,305.
U.S. Office Action mailed Sep. 8, 2006, from U.S. Appl. No. 10/404,693.
U.S. Office Action mailed Sep. 7, 2006, from U.S. Appl. No. 10/820,525.
U.S. Office Action mailed Jul. 12, 2006, from U.S. Appl. No. 10/672,305.
Wu et al., "Methods for Fabricating High Hardness/Modules Low Dielectric Constant Materials," Novellus Systems, Inc., U.S. Appl. No. 11/369,658, filed Mar. 6, 2006, pp. 1-33.
Dhas et al., "Method of Reducing Defects in PECVD TEOS Films," Novellus Systems, Inc., U.S. Appl. No. 11/396,303, filed Mar. 30, 2006, pp. 1-21.
Cho et al., "Mehtod for Porogen Removal and Mechanical Strength Enhancement of Low-K Carbon Doped Silicon Oxide Using Low Thermal Budget Microwave Curing", U.S. Appl. No. 11/280,113, filed Nov. 15, 2005.
U.S. Office Action mailed Apr. 3, 2008, from U.S. Appl. No. 10/982,654.
U.S. Office Action mailed Sep. 19, 2008, from U.S. Appl. No. 11/824,049.
U.S. Final Office Action mailed Jul. 10, 2008, from U.S. Appl. No. 10/807,680.
U.S. Final Office Action mailed Jul. 9, 2008, from U.S. Appl. No. 10/982,654.
U.S. Office Action mailed May 14, 2008, from U.S. Appl. No. 11/519,445.
U.S. Final Office Action mailed May 2, 2008, from U.S. Appl. No. 11/115,576.
U.S. Office Action mailed Oct. 17, 2008, from U.S. Appl. No. 11/115,576.
U.S. Office Action mailed Jul. 23, 2008, from U.S. Appl. No. 11/622,423.
U.S. Appl. No. 11/590,661, Office Action mailed Apr. 6, 2009.
U.S. Appl. No. 11/811,048, Office Action mailed Mar. 19, 2009.
Rodriquez, J.A. et al., "Evolution of the mechanical stress on PECVD silicon oxide films under thermal processing", Journal of Materials Science Letters 19, 2000, pp. 1399-1401.
U.S. Appl. No. 11/606,340, Office Action mailed Feb. 5, 2009.
U.S. Appl. No. 11/824,049, Office Action mailed Mar. 19, 2009.
U.S. Appl. No. 10/982,654, Office Action mailed Dec. 4, 2008.
U.S. Appl. No. 11/519,445, Office Action mailed Dec. 10, 2008.
U.S. Appl. No. 11/115,576, Office Action mailed Apr. 22, 2009.
U.S. Appl. No. 11/824,049, Notice of Allowance mailed Jun. 22, 2009.
U.S. Appl. No. 11/824,049, Allowed Claims.
U.S. Appl. No. 11/688,695, Office Action mailed Jun. 11, 2009.
U.S. Appl. No. 11/696,102, Office Action mailed Jul. 1, 2009.
Yu, J.J. et al., "UV Annealing of Ultrathin Tantalum Oxide Films", Applied Surface Science, V 186 (2002), 57-63.
U.S. Appl. No. 11/811,048, Notice of Allowance mailed Aug. 17, 2009.
U.S. Appl. No. 11/811,048, Allowed Claims.
U.S. Appl. No. 11/369,311, Office Action mailed Aug. 20, 2009.
U.S. Appl. No. 11/608,056, Office Action mailed Aug. 20, 2009.
P. Morin et al., "Tensile contact etch stop layer for nMOS performance enhancement: influence of the film morphology", ECS meeting, May 2005.
Takagi et al., "High Rate Deposition of a-Si:H and a-SiN$_x$:H by VHF PECVD", Vacuum, 51, 1998.
Smith, D.L et al., "Mechanism of SiN$_3$-SiH$_4$ Llasma", J. Electrochem. Soc., vol. 137 (2) 1990.
Nagayoshi et al., "Residual Stress of a Si$_{1-x}$N$_x$: H Films Prepared by Afterglow Plasma Chemical Vapor Deposition Technique", Jpn. J. Appl. Phys. vol. 31 (1992) pp. L867-L869 Part 2, No. 7A, Jul. 1, 1992.
Varadarajan et al., "Use of VHF RF plasma to deposit high tensile stress films with improved film properties for use in strained silicon technology", U.S. Appl. No. 11/975,473, filed Oct. 18, 2007.
U.S. Appl. No. 11/975,473, Office Action mailed Oct. 28, 2008.
U.S. Appl. No. 11/975,473, Office Action mailed Mar. 23, 2009.
Jiang et al., "Tensile dielectric films using UV curing", U.S. Appl. No. 11/899,683, filed Sep. 7, 2007.
U.S. Appl. No. 11/899,683, Office Action mailed May 29, 2009.
U.S. Appl. No. 11/519,445, Office Action mailed Aug. 26, 2009.
U.S. Appl. No. 11/622,409, Office Action mailed Jul. 1, 2009.
Haverkamp et al., "Enhancing adhesion of cap layer films", U.S. Appl. No. 11/731,581, filed Mar. 30, 2007.
U.S. Appl. No. 11/731,581, Office Action mailed Jun. 1, 2009.
U.S. Appl. No. 11/115,576, Office Action mailed Oct. 1, 2009.
U.S. Appl. No. 11/975,473, Office Action mailed Oct. 9, 2009.
Bandyopadhyay et al., "Method to Improve Mechanical Strength of Low-K Dielectric Film Using Modulated UV Exposure," Novellus Systems, Inc., U.S. Appl. No. 12/566,514, filed Sep. 24, 2009.
U.S. Appl. No. 11/622,409, Office Action mailed Nov. 5, 2009.
U.S. Appl. No. 11/519,445, Office Action mailed Nov. 4, 2009.
Haverkamp, et al., "Multi-Station Sequential Curing of Dielectric Films," Novellus Systems, Inc., U.S. Appl. No. 11/977,792, filed Oct. 25, 2007.
Haverkamp, et al., "Progressive UV Cure," Novellus Systems, Inc., U.S. Appl. No. 12/210,060, filed Sep. 12, 2008.
U.S. Appl. No. 11/696,102, Final Office Action mailed Dec. 22, 2009.
U.S. Appl. No. 11/369,311, Office Action mailed Jan. 5, 2010.
U.S. Appl. No. 11/688,695, Final Office Action mailed Dec. 31, 2009.
U.S. Appl. No. 11/590,661, Final Office Action mailed Jan. 25, 2010.
U.S. Appl. No. 11/656,661, Office Action mailed Jan. 22, 2010.
U.S. Appl. No. 11/731,581, Office Action mailed Feb. 4, 2010.
U.S. Appl. No. 11/899,683, Office Action mailed Feb. 8, 2010.
Wu, et al., "Methods for Fabricating Zeolite Nano-Crystal Based Low-K Dielectric Films Containing Si (CxHy)n Groups and Treating Films By Ultra-Violet Thermal Processing," Novellus Systems, Inc., U.S. Appl. No. 12/172,089, filed Jul. 11, 2008.
U.S. Appl. No. 11/977,792, Office Action mailed Mar. 9, 2010.
Chaabouni, H. et al., "Porous SiOCH Ultra Low-K recovery treatments after direct CMP process", Advanced Metallization Conference, Sep. 2008.
Chaabouni, H. et al., "Sidewall restoration of porous ultra low-$k$ dielectrics for sub-45 nm technology nodes", Microelectronic Engineering 84 (2007).
Huang, H. et al., "O2 Plasma Damage and Dielectric Recoveries to Patterned CDO Low-k Dielectrics", Advanced Metallization Conference, Sep. 2008.
U.S. Appl. No. 11/608,056, Office Action mailed Mar. 23, 2010.
U.S. Appl. No. 11/975,473, Office Action mailed Mar. 25, 2010.
Takagi et al., "High Rate Deposition of a-SiN$_x$:H by VHF PECVD", Mat. Res. Soc. Symp. Proc. vol. 467, 1997, Materials Research Society.
U.S. Appl. No. 12/726,263, "Apparatus for UV damage repair of low K films prior to copper barrier deposition", van Schravendijk et al., filed Mar. 17, 2010.
U.S. Appl. No. 11/519,445, Notice of Allowance mailed Apr. 21, 2010.
U.S. Appl. No. 11/519,445, Allowed Claims.
U.S. Appl. No. 11/561,834, Office Action mailed May 21, 2010.
U.S. Appl. No. 12/646,830, "UV and Reducing Treatment for K Recovery and Surface Clean in Semiconductor Processing", Varadarajan, Bhadri et al., filed Dec. 23, 2009.
U.S. Appl. No. 12/840,192, "Sequential deposition / anneal film densification method", Tarafdar et al., filed Jul. 20, 2010.
U.S. Appl. No. 11/688,695, Office Action mailed Jul. 23, 2010.
U.S. Appl. No. 11/590,661, Notice of Allowance mailed Aug. 6, 2010.
U.S. Appl. No. 11/656,661, Final Office Action mailed Aug. 24, 2010.
U.S. Appl. No. 12/172,089, Office Action mailed Sep. 13, 2010.

(56) References Cited

OTHER PUBLICATIONS

Li, Shuang et al., "Organic-functionalized pure-silica-zeolite MFI low-k films", Chem. Mater. 2005, 17, Mar. 9, 2005, pp. 1851-1854.
U.S. Appl. No. 11/731,581, Final Office Action mailed Sep. 2, 2010.
U.S. Appl. No. 11/977,792, Office Action mailed Oct. 25, 2010.
U.S. Appl. No. 11/975,473, Office Action mailed Nov. 1, 2010.
U.S. Appl. No. 11/608,056, Notice of Allowance mailed Nov. 2, 2010.
U.S. Appl. No. 12/566,514, Office Action mailed Jan. 11, 2011.
U.S. Appl. No. 11/561,834, Final Office Action mailed Dec. 3, 2010.
U.S. Appl. No. 11/696,102, Office Action mailed Jan. 26, 2011.
U.S. Appl. No. 11/688,695, Office Action mailed Feb. 1, 2011.
U.S. Office Action mailed Dec. 12, 2007, from U.S. Appl. No. 11/146,456.
U.S. Final Office Action mailed Jul. 25, 2008, from U.S. Appl. No. 11/146,456.
U.S. Appl. No. 11/146,456, Notice of Allowance mailed Nov. 10, 2008.
U.S. Appl. No. 11/146,456, Supplemental Notice of Allowance mailed Dec. 15, 2008.
Draeger et al., "Creation of Porosity in Low-K Films by Photo-Disassociation of Imbedded Nanoparticles," U.S. Appl. No. 12/369,384, filed Feb. 11, 2009.
U.S. Office Action mailed Feb. 22, 2011, from U.S. Appl. No. 12/369,384.
U.S. Appl. No. 11/369,311, Office Action mailed Apr. 13, 2011.
U.S. Appl. No. 12/172,089, Final Office Action mailed Apr. 14, 2011.
U.S. Appl. No. 11/656,661, Office Action mailed May 19, 2011.
U.S. Appl. No. 11/731,581, Office Action mailed Jun. 2, 2011.
U.S. Appl. No. 12/646,830, "UV and reducing treatment for K recovery and surface clean in semiconductor processing", Varadarajan et al., filed Dec. 23, 2009.
U.S. Appl. No. 11/977,792, Office Action mailed Jul. 6, 2011.
U.S. Appl. No. 11/897,838, Office Action mailed Jul. 11, 2011.
U.S. Appl. No. 12/646,830, Office Action mailed Jul. 15, 2011.
Notice of Allowance for U.S. Appl. No. 12/566,514, mailed Jul. 13, 2011.
Allowed Claims as of Jul. 13, 2011 for U.S. Appl. No. 12/566,514.
U.S. Appl. No. 11/696,102, Final Office Action mailed Aug. 11, 2011.
Notice of Allowance for U.S. Appl. No. 12/369,384, mailed Aug. 19, 2011.
Allowed Claims as of Aug. 19, 2011 for U.S. Appl. No. 12/369,384.
Korean Notification of Provisional Rejection mailed Dated Jul. 12, 2011 for Application No. 10-2010-0066153.
U.S. Appl. No. 11/369,311, Final Office Action mailed Sep. 29, 2011.
U.S. Appl. No. 12/973,549, Office Action mailed Oct. 11, 2011.
U.S. Appl. No. 11/977,792, Office Action mailed Oct. 24, 2011.
U.S. Appl. No. 11/656,661, Final Office Action mailed Nov. 10, 2011.
U.S. Appl. No. 12/940,324, Office Action mailed Dec. 13, 2011.
U.S. Appl. No. 11/731,581, Office Action mailed Nov. 28, 2011.
U.S. Appl. No. 11/115,576, Notice of Allowance mailed Nov. 14, 2011.
U.S. Appl. No. 12/210,060, Office Action mailed Nov. 28, 2011.
U.S. Appl. No. 12/646,830, Office Action mailed Jan. 11, 2012.
U.S. Appl. No. 11/688,695, Office Action mailed Dec. 14, 2011.
U.S. Appl. No. 12/840,192, Office Action mailed Feb. 6, 2012.
U.S. Appl. No. 13/275,209, Office Action mailed Mar. 12, 2012.
U.S. Appl. No. 11/369,311, Office Action mailed Mar. 7, 2012.
U.S. Appl. No. 11/696,102, Notice of Allowance mailed Feb. 24, 2012.
U.S. Appl. No. 11/897,838, Notice of Allowance mailed Mar. 2, 2012.
Deshmukh, et al., "Remote Plasma Etching Reactors: Modeling and Experiment," J. Vac. Sci. Technol., B 11(2), Mar./Apr. 1993, pp. 206-215.

SG patent application No. 2010079747, Examination Report mailed Apr. 25, 2012.
U.S. Appl. No. 12/726,263, Office Action mailed May 31, 2012.
Varadarajan et al., "A Cascaded Cure Approach to Fabricate Highly Tensile Silicon Nitride Films," Novellus Systems, Inc., U.S. Appl. No. 13/487,051, filed Jun. 1, 2012.
U.S. Appl. No. 12/646,830, Final Office Action mailed May 25, 2012.
U.S. Appl. No. 12/973,549, Office Action mailed Jun. 7, 2012.
U.S. Appl. No. 12/840,192, Office Action mailed Jul. 19, 2012.
U.S. Appl. No. 11/656,661, Office Action mailed Jul. 19, 2012.
U.S. Appl. No. 13/275,209, Final Office Action mailed Aug. 15, 2012.
U.S. Appl. No. 11/369,311, Final Office Action mailed Jul. 31, 2012.
U.S. Appl. No. 11/688,695, Office Action mailed Jun. 21, 2012.
U.S. Appl. No. 11/731,581, Office Action mailed Aug. 28, 2012.
U.S. Office Action dated Oct. 6, 2005 issued in U.S. Appl. No. 10/975,028.
U.S. Office Action dated Mar. 24, 2006 issued in U.S. Appl. No. 10/975,028.
U.S. Notice of Allowance dated May 8, 2006 issued in U.S. Appl. No. 10/975,028.
U.S. Notice of Allowance dated Sep. 20, 2012 issued in U.S. Appl. No. 12/840,192.
U.S. Supplemental Notice of Allowance dated Oct. 8, 2009 issued in U.S. Appl. No. 11/811,048.
U.S. Notice of Allowance dated Oct. 4, 2012 issued in U.S. Appl. No. 11/688,695.
U.S. Final Office Action dated Sep. 10, 2012 issued in U.S. Appl. No. 12/726,263.
US Office Action, dated Jan. 3, 2013, issued in U.S. Appl. No. 13/487,051.
U.S. Final Office Action dated Oct. 3, 2012, issued in U.S. Appl. No. 12/210,060.
U.S. Office Action dated Jan. 3, 2013 issued in U.S. Appl. No. 12/973,549.
Korean Notification of Provisional Rejection dated Mar. 26, 2012 issued in Appl. No. 11-2010-0066153.
PCT International Search Report and Written Opinion dated Dec. 26, 2012, issued in WO Patent Application No. PCT/US2011/064246.
Shrinivassan et al., "Multi-Station Sequential Curing of Dielectric Films," U.S. Appl. No. 14/086,732, filed Nov. 21, 2013.
US Office Action (Supplemental), dated Jan. 10, 2006, issued in U.S. Appl. No. 10/672,311.
U.S. Office Action dated Jul. 25, 2013 issued in U.S. Appl. No. 13/275,209.
U.S. Notice of Allowance dated Jan. 9, 2014 issued in U.S. Appl. No. 13/275,209.
U.S. Final Office Action dated Jan. 30, 2013 issued in U.S. Appl. No. 11/656,661.
U.S. Notice of Allowance dated May 3, 2010 issued in U.S. Appl. No. 11/519,445.
U.S. Office Action dated Mar. 15, 2013 issued in U.S. Appl. No. 12/840,192.
U.S. Office Action dated Jun. 11, 2013 issued in U.S. Appl. No. 11/369,311.
U.S. Final Office Action dated Oct. 25, 2013 issued in U.S. Appl. No. 11/369,311.
U.S. Office Action dated Mar. 17, 2014 issued in U.S. Appl. No. 11/369,311.
U.S. Notice of Allowance dated Jul. 17, 2014 issued in U.S. Appl. No. 11/369,311.
U.S. Notice of Allowance dated Feb. 14, 2013 issued in U.S. Appl. No. 11/688,695.
U.S. Office Action dated Jul. 19, 2013 issued in U.S. Appl. No. 13/886,694.
U.S. Notice of Allowance dated Sep. 12, 2013 issued in U.S. Appl. No. 13/886,694.
U.S. Office Action dated Jun. 18, 2015 issued in U.S. Appl. No. 14/086,732.
U.S. Final Office Action dated Nov. 20, 2015 issued in U.S. Appl. No. 14/086,732.

(56) References Cited

OTHER PUBLICATIONS

U.S. Office Action dated Feb. 25, 2014 issued in U.S. Appl. No. 11/977,792.
U.S. Notice of Allowance dated Oct. 8, 2014 issued in U.S. Appl. No. 11/977,792.
U.S. Notice of Allowance dated Feb. 9, 2015 issued in U.S. Appl. No. 11/977,792.
U.S. Final Office Action dated Jun. 14, 2013 issued in U.S. Appl. No. 11/731,581.
U.S. Office Action dated Mar. 31, 2014 issued in U.S. Appl. No. 14/026,894.
U.S. Final Office Action dated Dec. 5, 2014 issued in U.S. Appl. No. 14/026,894.
U.S. Office Action dated Mar. 6, 2013, issued in U.S. Appl. No. 12/726,263.
U.S. Final Office Action, dated Aug. 7, 2013, issued in U.S. Appl. No. 12/726,263.
U.S. Notice of Allowance, dated Apr. 22, 2013, issued in U.S. Appl. No. 13/487,051.
U.S. Office Action dated Apr. 24, 2014 issued in U.S. Appl. No. 12/210,060.
U.S. Final Office Action dated Nov. 17, 2014, issued in U.S. Appl. No. 12/210,060.
U.S. Notice of Allowance dated Feb. 5, 2015, issued in U.S. Appl. No. 12/210,060.
U.S. Office Action dated Mar. 6, 2013 issued in U.S. Appl. No. 12/646,830.
U.S. Final Office Action dated Jul. 30, 2013 issued in U.S. Appl. No. 12/646,830.
U.S. Office Action dated Feb. 20, 2014 issued in U.S. Appl. No. 12/646,830.
U.S. Final Office Action dated Sep. 12, 2014 issued in U.S. Appl. No. 12/646,830.
U.S. Office Action dated Sep. 3, 2015 issued in U.S. Appl. No. 12/646,830.
U.S. Final Office Action dated Feb. 2, 2016 issued in U.S. Appl. No. 12/646,830.
U.S. Notice of Allowance dated Feb. 22, 2013 issued in U.S. Appl. No. 12/973,549.
U.S. Office Action dated Mar. 24, 2016 issued in U.S. Appl. No. 14/546,990.
U.S. Final Office Action dated Sep. 9, 2016 issued in U.S. Appl. No. 14/546,990.
Chinese Office Action dated Jan. 14, 2013 issued in Application No. CN 201010539625.7.
Chinese Second Office Action dated Sep. 10, 2013 issued in Application No. CN 201010539625.7.
Chinese Third Office Action dated May 23, 2014 issued in Application No. CN 201010539625.7.
Chinese Fourth Office Action dated Mar. 24, 2015 issued in Application No. CN 201010539625.7.
Chinese Fifth Office Action dated Oct. 19, 2015 issued in Application No. CN 201010539625.7.
Chinese Sixth Office Action dated Mar. 17, 2016 issued in Application No. CN 201010539625.7.
Chinese Seventh Office Action dated Jun. 28, 2016 issued in Application No. CN 201010539625.7.
Taiwan Office Action dated Mar. 27, 2013 issued in Application No. TW 099123184.
PCT International Preliminary Report on Patentability and Written Opinion dated Jul. 4, 2013, issued in PCT/US2011/064246.
Korean Office Action dated Sep. 26, 2013, issued in Application No. KR 2013-7019282.
Korean Second Office Action dated Dec. 5, 2013, issued in Application No. KR 2013-7019282.
Taiwan Search Report dated Aug. 20, 2013 issued in Application No. TW 100147212.
Daumont et al., (1992) "Ozone UV Spectroscopy I: Absorption Cross-Sections at Room Temperature," Journal of Atmospheric Chemistry, 15:145-155.
Ityaksov, D. et al., (2008) "Deep-UV absorption and Rayleigh scattering of carbon dioxide," Chemical Physical Letters, 462:31-34.
Malicet et al., (1995) "Ozone UV Spectroscopy. II. Absorption Cross-Sections and Temperature Dependence," Journal of Atmospheric Chemistry, 21:263-273.
van Dishoeck, et al., (Jun. 20, 2011) "Molecular photodissociation," Modern Concepts in Laboratory Astrochemistry, arXiv:1106.3917v1 [astro-ph.IM], 18 pp.
Venot, O. et al., (2013) "High-temperature measurements of VUV-absorption cross sections of $CO_2$ and their application to exoplanets," Astronomy & Astrophysics, 551:A131.

* cited by examiner

TENSILE DIELECTRIC FILMS USING UV CURING

FIELD OF THE INVENTION

This invention relates to electronic devices and associated fabrication processes. More specifically, the invention relates to highly tensile dielectric films on heat sensitive substrates formed by UV curing, for example implemented in a strained transistor architecture for NMOS devices in which a highly tensile silicon nitride capping layer is provided on the source and drain regions to induce tensile strain in the NMOS channel region.

BACKGROUND OF THE INVENTION

As transistors are scaled to smaller dimensions there is a need for higher switching speeds. One solution to increase transistor speed is to strain the silicon in the channel. Adding a small amount of strain to the silicon lattice structure is believed to promote higher electron and hole mobilities, which increase transistor drain current and device performance.

While the present invention is not limited by an particular theory, it is believed that when a silicon lattice is under tensile strain, its physical symmetry is broken, and with it the electronic symmetry. The lowest energy level of the conduction band is split, with two of the six original states dropping to a lower energy level and four rising to a higher energy level. This renders it more difficult for the electrons to be 'scattered' between the lowest energy states by a phonon, because there are only two states to occupy. Whenever electrons scatter, their motion is randomized. Reducing scatter increases the average distance an electron can travel before it is knocked off course, increasing its average velocity in the conduction direction. Also, distorting the lattice through tensile strain can distort the electron-lattice interaction in a way that reduces the electron's effective mass, a measure of how much it will accelerate in a given field. As a result, electron transport properties like mobility and velocity are improved and channel drive current for a given device design is increased in a strained silicon channel, leading to improved transistor performance.

Transistor strain has been generated in NMOS devices by using a highly tensile post-salicide silicon nitride capping layer on the source and drain regions. The stress from this capping layer is uniaxially transferred to the NMOS channel through the source-drain regions to create tensile strain in the NMOS channel. For example, a 1000 Å silicon nitride capping layer with a stress of 1E10 dynes/cm$^2$ has been shown to provide a 10% NMOS $I_{DSAT}$ gain from tensile channel strain (Ghani, et al., A 90 nm High Volume Manufacturing Logic Technology Featuring Novel 45 nm Gate Length Strained Silicon CMOS Transistors, IEEE (2003), incorporated by reference herein in its entirety for all purposes). However, a tensile stress in excess of 1E10 dynes/cm$^2$ is necessary for optimal results.

This highly tensile silicon nitride capping layer is generally deposited using a thermal CVD process, e.g., LPCVD. However, these processes generally require temperatures of greater than 500° C. to remove hydrogen from the capping layer thereby inducing tensile stress in the capping layers, and at these higher temperatures the underlying NiSi (silicide/salicide) substrate for the capping layer undergoes phase transformation that increases its resistivity. Hence, thermal budget constraints for future transistor architectures require the films to be deposited at temperatures below 450° C. A lower temperature thermal anneal may be used, for example, one in which the anneal temperature does not exceed 450° C. However, the duration of a thermal anneal process at that temperature that is necessary to obtain the benefit (e.g., about 2 hours) is not economically viable, and neither is the stress achieved sufficiently high.

Accordingly, new fabrication processes for generating NMOS transistor channel strain are needed.

SUMMARY OF THE INVENTION

The present invention addresses this need by providing a processing technique to generate a highly tensile dielectric layer on a heat sensitive substrate while not exceeding thermal budget constraints. Ultraviolet (UV) irradiation is used to produce highly tensile films to be used, for example, in strained NMOS transistor architectures. UV curing of as-deposited PECVD silicon nitride films, for example, has been shown to bring about significant hydrogen removal and pore shrinkage, resulting in tremendous stress changes. Films with stresses of at least 1.65 E10 dynes/cm$^2$ have been successfully produced using this technique. Other dielectric capping layer film materials show similar behavior, wherein the tensile stress increases after they have been UV-cured. In transistor implementations, the stress from a capping layer composed of such a film is uniaxially transferred to the NMOS channel through the source-drain regions to create tensile strain in the NMOS channel.

These and other aspects and advantages of the invention are described further below and with reference to the drawings.

DETAILED DESCRIPTION OF THE INVENTION

Figure 1A:
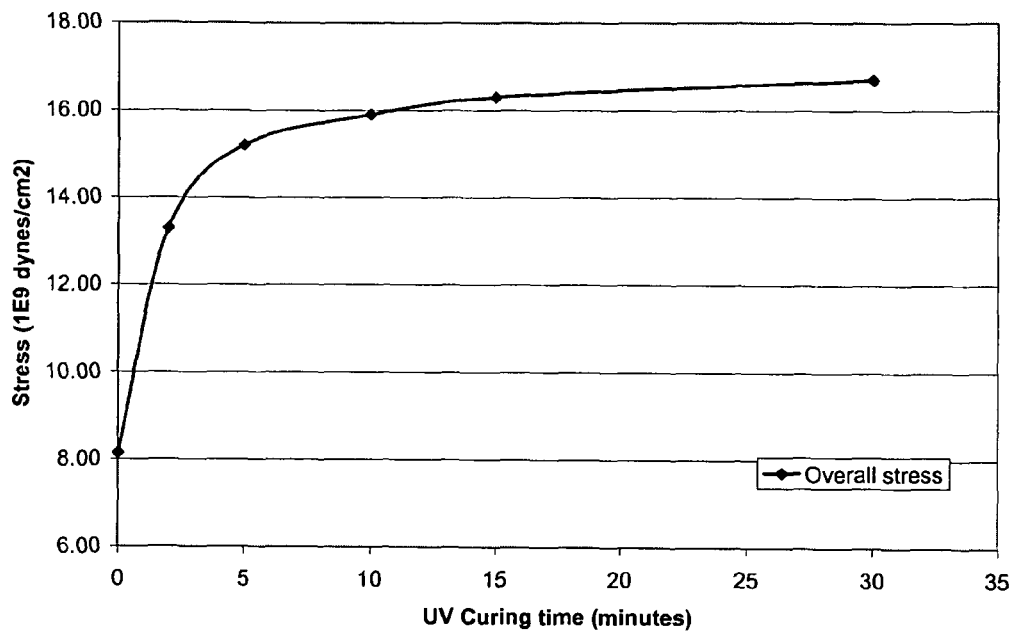
FIG. 1A shows a plot of the effect of UV curing time on the stress of a PECVD silicon nitride film deposited at 400° C. in accordance with one embodiment of the present invention.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

The present invention provides a processing technique to generate a highly tensile dielectric layer on a heat sensitive substrate while not exceeding thermal budget constraints. Ultraviolet (UV) irradiation is used to produce highly tensile films to be used, for example, in strained NMOS transistor architectures. UV curing of as-deposited PECVD silicon nitride films, for example, has been shown to produce films with stresses of at least 1.65 E10 dynes/cm$^2$. Other dielectric capping layer film materials show similar results. In transistor implementations, the stress from a capping layer composed of such a film is uniaxially transferred to the NMOS channel through the source-drain regions to create tensile strain in NMOS channel. The architecture has been developed for 90 nm logic technology on 300 mm wafers, although it is not so limited in application.

Post-Deposition UV Treatment of Dielectric Layer

The post-deposition UV treatment, also referred to as UV curing, technique of the invention generates a highly tensile dielectric layer on a heat sensitive substrate without thermally degrading the substrate. In a particular implementation, source/drain salicide capping layer stress in NMOS transistors is increased without thermally degrading the salicide. The technique involves post-deposition UV treatment of a capping layer film on a heat sensitive substrate, e.g., a silicide (or salicide) such as NiSi. In a specific embodiment, the capping layer is composed of silicon nitride (SiN or $Si_3N_4$) deposited by PECVD and the invention is primarily described herein with respect to this embodiment. In alternative embodiments, however, the capping layer may be deposited by other thermal CVD process, e.g., low pressure CVD (LPCVD), atmospheric pressure CVD (APCVD) or other suitable techniques such as spin-coating, print-coating, and dip-coating, and be composed of other dielectric materials including silicon carbide (SiC), oxygen-doped silicon carbide (SiCO), nitrogen-doped silicon carbide (SiCN), silicon boron nitride (SiBN), silicon boron carbide (SiBC), and silicon oxide (SiO or $SiO_2$), and the invention should be understood to apply to these capping layer materials as well.

PECVD films in general contain a considerable amount of hydrogen. For example, PECVD silicon nitride films contain generally contain about 15-30% hydrogen in the form of Si—H and N—H bonds. Again, while the invention is not limited by this theory, it is generally accepted that irreversible tensile stress develops in PECVD films from the reduction of the amount of hydrogen in the film, and due to shrinkage of voids. The loss of hydrogen and shrinkage of voids result in a volume reduction in the film. But the constraint of the substrate prevents any lateral shrinkage, thus imposing tensile strains in the film. The change in hydrogen concentration has been shown to be proportional to the irreversible stress change. Thermal annealing at temperatures in excess of 500° C., e.g., 600° C., are best known to remove the hydrogen from such a film (silicon nitride) by providing sufficient energy to attain the right bonding configuration and stoichiometry, in particular the removal of H and formation of extended Si—N bonds.

It has now been found that UV irradiation is a source of energy that makes compressive films tensile and tensile films even more tensile. It is believed that the photons from the UV source for example, a "H bulb" of a Hg lamp having a nominal wavelength from about 150 nm to 800 nm and an intensity of between 1 $\mu W/cm^2$ and 10 $W/cm^2$, provide sufficient energy to break most H-bonds in a dielectric film, e.g., for a silicon nitride film, the Si—H and N—H bonds. UV irradiation has a penetration depth sufficient to treat a film of full thickness, for example, between about 50 and 30,000 Å, e.g., about 300-1500, such as 700 Å. A following gas, such as He, Argon, $N_2$ or $CO_2$ may be used as a purging gas during UV curing. Other reactive gases such as $O_2$, $CO_2$, $N_2O$, $H_2$ $H_2O$ vapor, and vapors of alcohols (such as methanol, ethanol, isopropal alcohol [IPA]), may be used to further modulate the UV curing process. The process pressure may vary between $10^{-3}$ to 1000 Ton. At a moderate substrate temperature (e.g., between about 25-500° C.) and UV exposure, the H atoms from neighboring broken bonds combine to form $H_2$ that diffuses out of the film. The removal of hydrogen leaves behind micro voids in the film, along with the voids formed during deposition. The photon energy from the UV source, coupled with the thermal energy due to the wafer temperature cause these voids to shrink (in order to minimize surface energy). This shrinkage imposes significant tensile strains in the film.

The UV treatment may be implemented in a continuous mode or pulsing mode to further optimize the end result on the final film. In a continuous exposure mode, the film is irradiated with a continuous UV source. In a pulsing mode, the film is exposed to pulses of UV radiation, leading to a sequence of curing/quenching/curing/quenching events. By modulating the pulse length and the duty-cycle of the pulses, the film stress and other properties may be further optimized.

Table 1, below, provides suitable PECVD deposition conditions for a silicon nitride layer suitable as a capping layer in accordance with the present invention:

TABLE 1

| Parameter | Range |
| --- | --- |
| SiH4 (sccm) | 100-200 |
| NH3 (sccm) | 1000-4000 |
| N2 (sccm) | 5000-10000 |
| HFRF (W) | 500-1200 |
| Pressure (Torr) | 6-8 |
| Temperature (° C.) | $250 \leq X \leq 450$ |

Figure 1B:
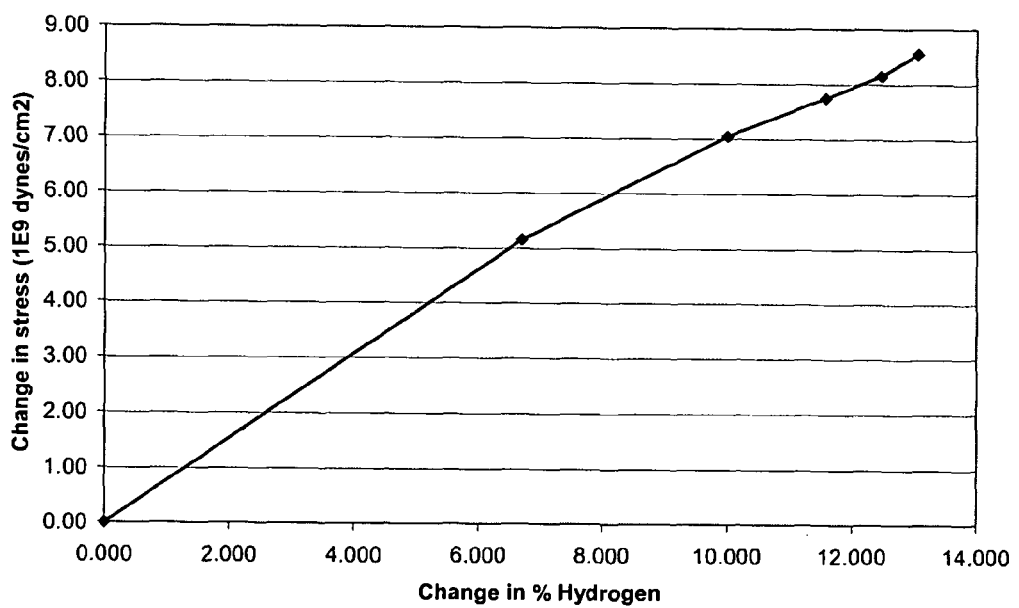
FIG. 1B shows the correlation between change in stress and change in hydrogen content of a PECVD silicon nitride film (deposited at 400° C.) that has been cured for different lengths of time in accordance with one embodiment of the present invention.

FIG. 1A shows a plot of the effect of UV curing time on the stress of a PECVD silicon nitride film deposited at 400° C. FIG. 1B shows the correlation between the change in stress and change in hydrogen content. It can be seen that the stress change resulting from UV curing of a PECVD silicon nitride film is proportional to the change in hydrogen content of the film. This has been found to be the case where substrate temperature during UV cure is sufficiently high (e.g., between about 380-450° C.). Lower substrate temperatures result in lower diffusivity of hydrogen, and also do not provide sufficient energy for atomic rearrangement to occur. This reduces the amount of hydrogen removed from the film, and also the degree of pore shrinkage. Higher UV dosages (e.g., longer treatment or increased UV intensity)

and higher wafer temperatures result in increased tensile stress for the UV cured SiN films. Thus, UV curing processing can be tailored to find an appropriate balance between tensile stress increase and process efficiency. This is facilitated by the fact that most of the hydrogen evolution and corresponding stress increase occurs within the first few minutes of the treatment. For example, as shown in FIG. 1A, most of the change in stress occurred within the first 5 minutes of UV irradiation, 10 minutes of UV curing resulted in a stress of about 1.60 E10 dynes/cm² on a 700 Å SiN film that had an as-deposited stress of about 8 E9 dynes/cm², a stress change of about 8 E9 dynes/cm²).

Table 2, below, provides an example of typical UV curing conditions for a silicon nitride layer suitable as a capping layer in accordance with the present invention:

TABLE 2

| Parameter | Range |
| --- | --- |
| He flow (sccm) | 3000 |
| Wafer Temperature | 380-450° C. |
| UV Power (W/cm²) | 1.0-3.0 for 200-400 nm wavelength |
| Pressure (Torr) | 6-8 |

Figure 2:
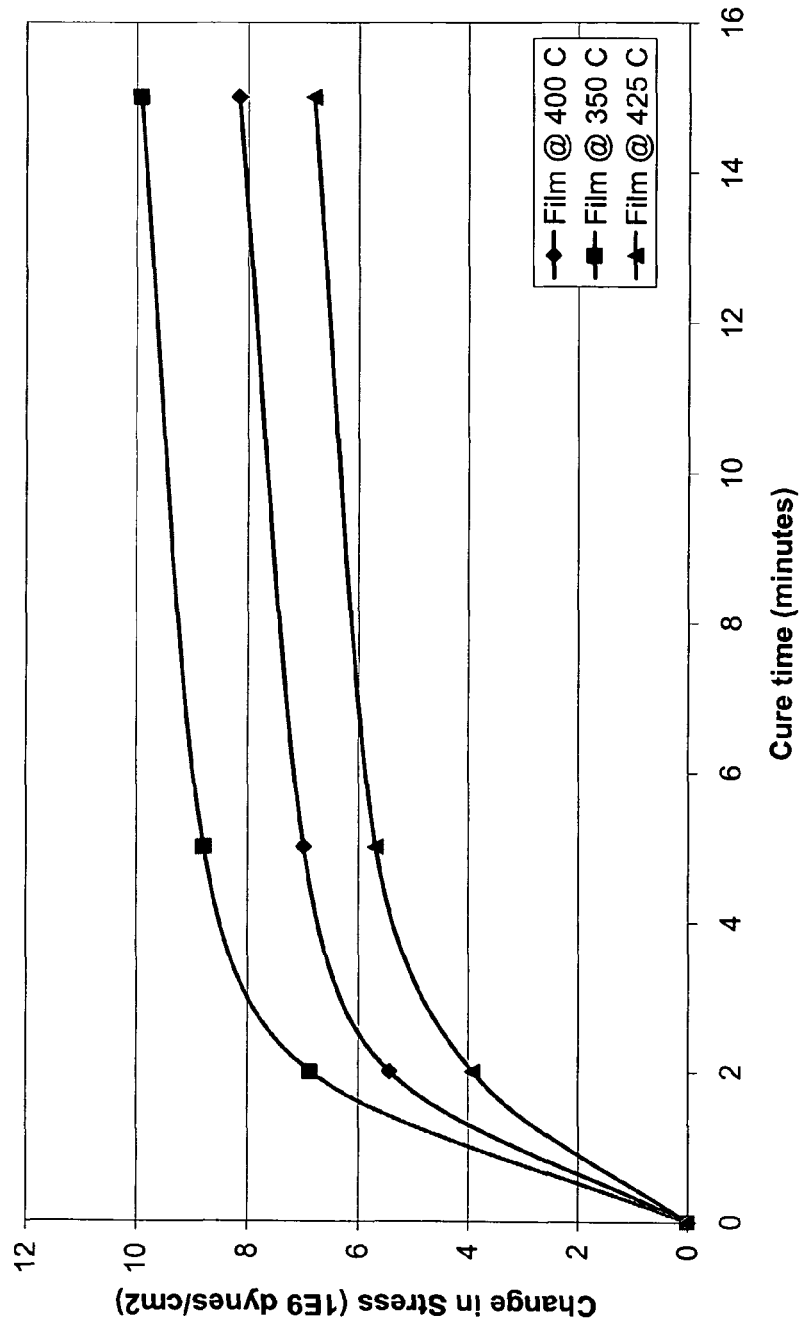
FIG. 2 is a plot of the increase in tensile stress with UV curing time for PECVD silicon nitride films deposited at different temperatures in accordance with one embodiment of the present invention.

The initial as-deposited structure and composition of the film influences the extent of the stress change and final stress that may be induced by UV curing. Films that are highly porous and that contain considerable hydrogen show a higher change in stress after UV curing. Increased hydrogen removal, and associated shrinkage are the probable causes for this behavior. An illustration of this effect is shown in FIG. 2 which is a plot of the increase in tensile stress with UV curing time for about 700 Å PECVD silicon nitride films deposited using the same processing conditions at temperatures of 400, 350 and 425° C., respectively. The films deposited at a lower temperature have a higher hydrogen content and are less dense. The change in stress, after UV curing for the same time, was the highest for the film deposited at the lowest temperature (350° C.).

The final stress on a film is a combination of the initial as-deposited stress and change in stress after UV curing. Silicon nitride films with a stress of at least 1.65 E10 dynes/cm² have been achieved using the UV curing technique of the present invention, thus demonstrating the ability to produce high stress dielectric films without high temperature (e.g., >450° C.) thermal processing. Highly tensile silicon nitride films obtained using this method can be used in strained NMOS transistor structures to improve the device performance.

Figure 3:
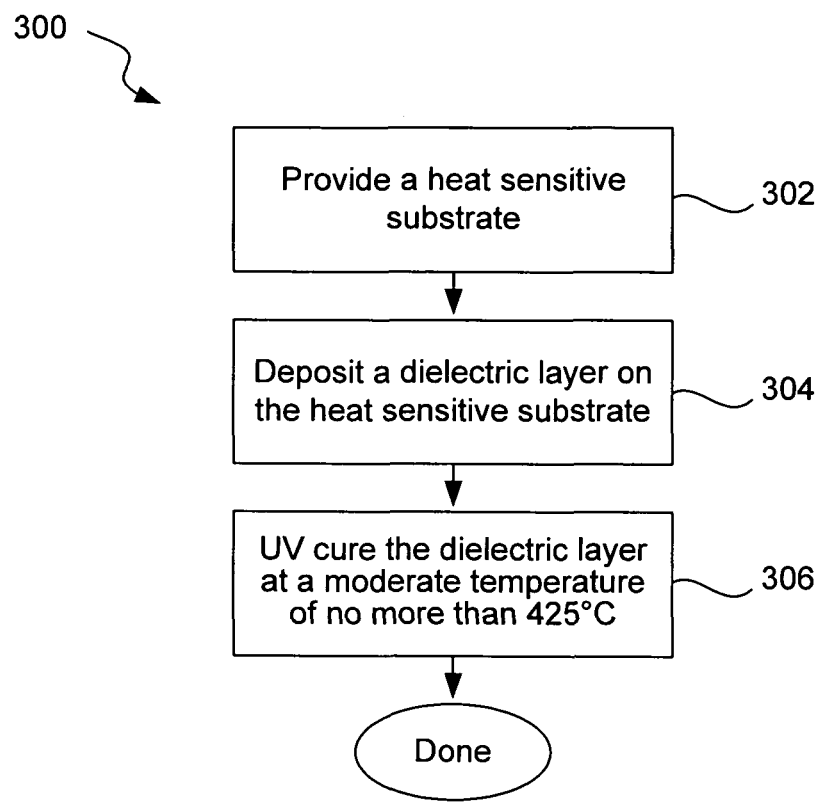
FIG. 3 depicts important stages in a process flow for a method of fabricating a high tensile stress dielectric film in accordance with an embodiment of the present invention.

FIG. 3 depicts important stages in a process flow for a method of fabricating a tensile stressed dielectric in accordance with an embodiment of the present invention. The method 300 involves providing a heat sensitive substrate (302), such as layer of silicide. The dielectric layer is formed by depositing a dielectric, such as silicon nitride, on the silicide substrate by a CVD process, e.g., PECVD, at a temperature of no more than 450° C. (304). The deposited dielectric is then exposed to UV radiation, for example from Hg lamp having a nominal wavelength from about 150 nm to 800 nm, at a moderate temperature, for example, between about 25 and 500° C. (306). Hydrogen is removed from the dielectric thereby inducing tensile stress.

Integration of Different Stresses

Another aspect of the present invention that provides advantages over prior processes is the ability to use the UV curing process to integrate multiple different regions of dielectric stress on a common substrate. Because the UV curing process is optical in nature, selective masking may be used to limit exposure of a dielectric region to the UV radiation. In this way, using well known photolithographic masking techniques, some regions of a substrate, for example a semiconductor wafer, may be masked to prevent UV exposure and the associated increase in tensile stress, while, in the same UV irradiation step, other regions may be exposed so that tensile stress in those regions is increased. Similarly, if multiple deposition and/or UV irradiation steps are used, different regions of the substrate may be subjected to varying degrees of UV exposure by masking in one step but not another, for example. Thus, regions of compressive stress and/or varying degrees of tensile stress may be efficiently formed on the same substrate without thermal damage to other elements on the substrate, such as an underlying heat sensitive material.

According to this aspect of the invention UV curing may be used to continuously modulate the stress of dielectric films including silicon nitride, silicon carbide and silicon oxide for a variety of semiconductor manufacturing applications. The resulting films, depending on the process conditions of the UV cure and the starting film stress, can exhibit tunable stress values from compressive to tensile. This approach to achieve high tensile stress of silicon nitride films can be readily used in front-end spacer applications for 65 and 45 nm technologies, for example.

Transistor Architecture

Figure 4:
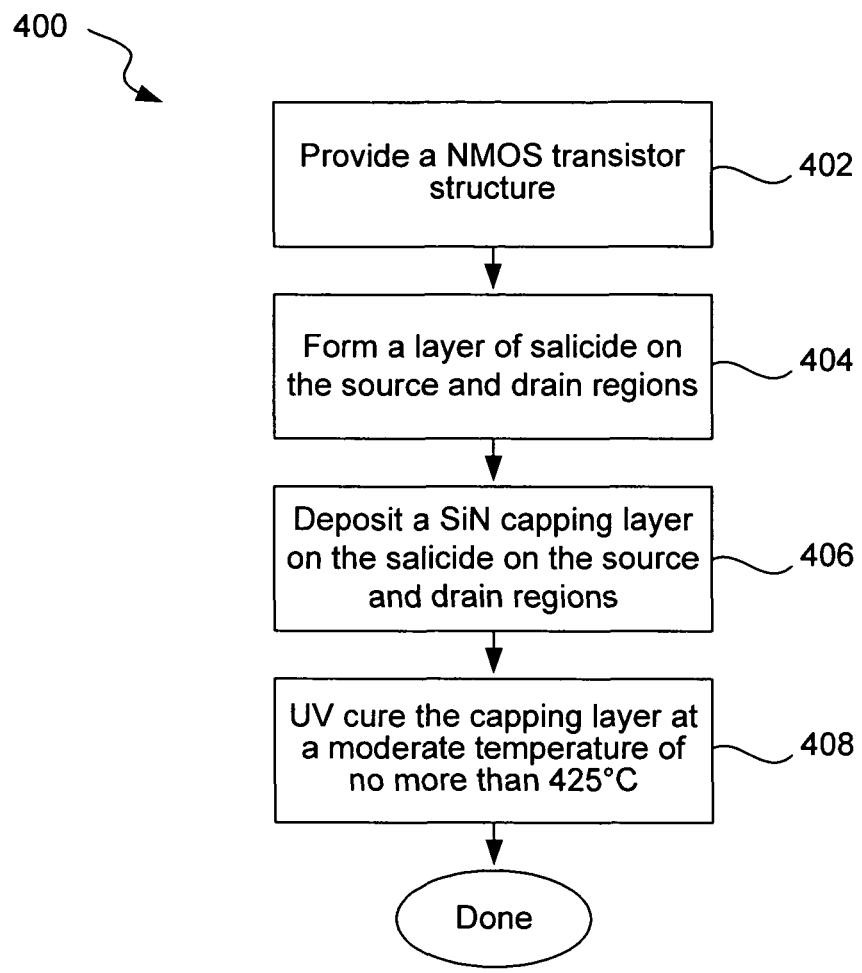
FIG. 4 depicts important stages in a process flow for a method of fabricating a strained transistor structure in accordance with an embodiment of the present invention.

FIG. 4 depicts important stages in a process flow for a method of fabricating a strained transistor structure in accordance with specific embodiment of the present invention. The method 400 involves providing a NMOS transistor structure (402), the NMOS transistor structure having a substrate, a conductive gate separated from the substrate by a gate dielectric, source and drain regions in the well on either side of the gate, and a channel region underlying the gate. A layer of salicide is formed on the source and drain regions (404). A highly tensile silicon nitride (SiN) capping layer is then formed on the salicide overlying the source and drain regions. The SiN capping layer is formed by depositing a SiN layer on the salicide of the source and drain regions (406), and then UV curing the capping layer by exposure to UV radiation, for example from a Hg lamp having a nominal wavelength from about 200 nm to 400 nm, at a moderate temperature, for example, between about 380 and 450° C. (408). Hydrogen is removed from the capping layer thereby inducing tensile stress in the capping layer that is transferred to the NMOS channel through the source and drain regions resulting in a strained channel.

Figure 5:
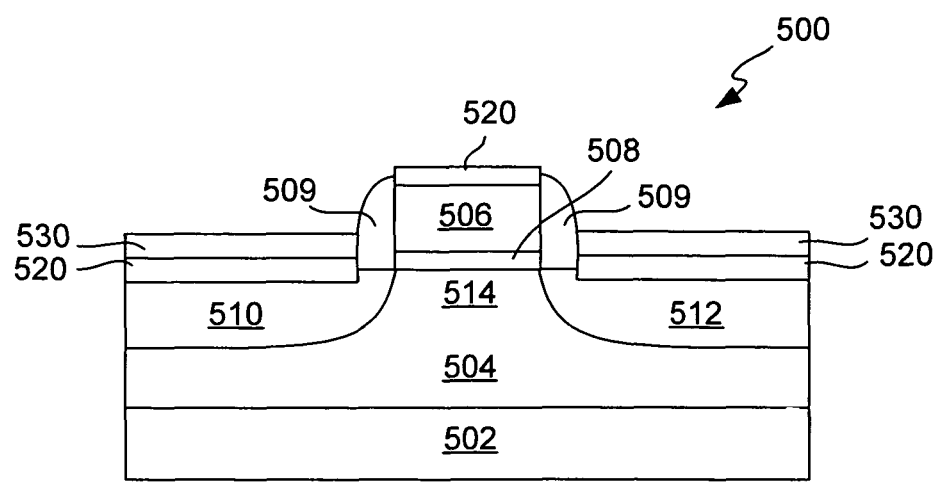
FIG. 5 depicts a simple transistor architecture in accordance with an embodiment of the present invention.

FIG. 5 illustrates a simple transistor architecture in accordance with one embodiment of the present invention. The transistor 500 typically has a NMOS transistor structure composed of a p-doped substrate 502, an n-doped well 504 within the substrate 502, a conductive gate 506 separated from the n-well 504 of the substrate 502 by a gate dielectric 508 and p-doped source 510 and drain 512 regions in the well 504 on either side of the gate 506, and a channel 514 region underlying the gate 506. There may also be sidewall spacers 509 on the gate 506. The source 510 and drain 512 regions and the gate 506 are covered with a layer of self-aligned silicide (salicide) 520, and the salicide is covered with a silicon nitride (SiN) capping layer 530. The channel 514 region is strained by tensile stress in the capping layer 530 transferred to the channel 514 region via the source 510 and drain 512 regions, and the salicide 520 resistivity is substantially as on formation. The SiN capping layer 530 is formed on the salicide 520 by the UV curing technique described above that does not require a temperature of greater than 450° C. such that the salicide 520 is not thermally degraded by the application of the capping layer 530. As a result, the resistivity of the salicide 520 in the final transistor 500 remains substantially as on deposition.

Apparatus

The present invention can be implemented in many different types of apparatus. Generally, the apparatus will include one or more chambers (sometimes referred to as process vessels) that house one or more substrates, e.g., semiconductor wafers, and are suitable for wafer processing. At least one chamber will include a UV source. A single chamber may be employed for all operations of the invention or separate chambers may be used. Each chamber may house one or more wafers for processing. The one or more chambers maintain the wafer in a defined position or positions (with or without motion within that position, e.g. rotation, vibration, or other agitation) during deposition and post-deposition UV curing processes. The apparatus generally includes a heating platen for operations in which the wafer is to be heated. The present invention is preferably implemented in a plasma enhanced chemical vapor deposition (PECVD) reactor. In a preferred embodiment of the invention, a Vector™ or Sequel™ reactor, produced by Novellus Systems of San Jose, Calif., may be used to implement the invention.

Figure 6:
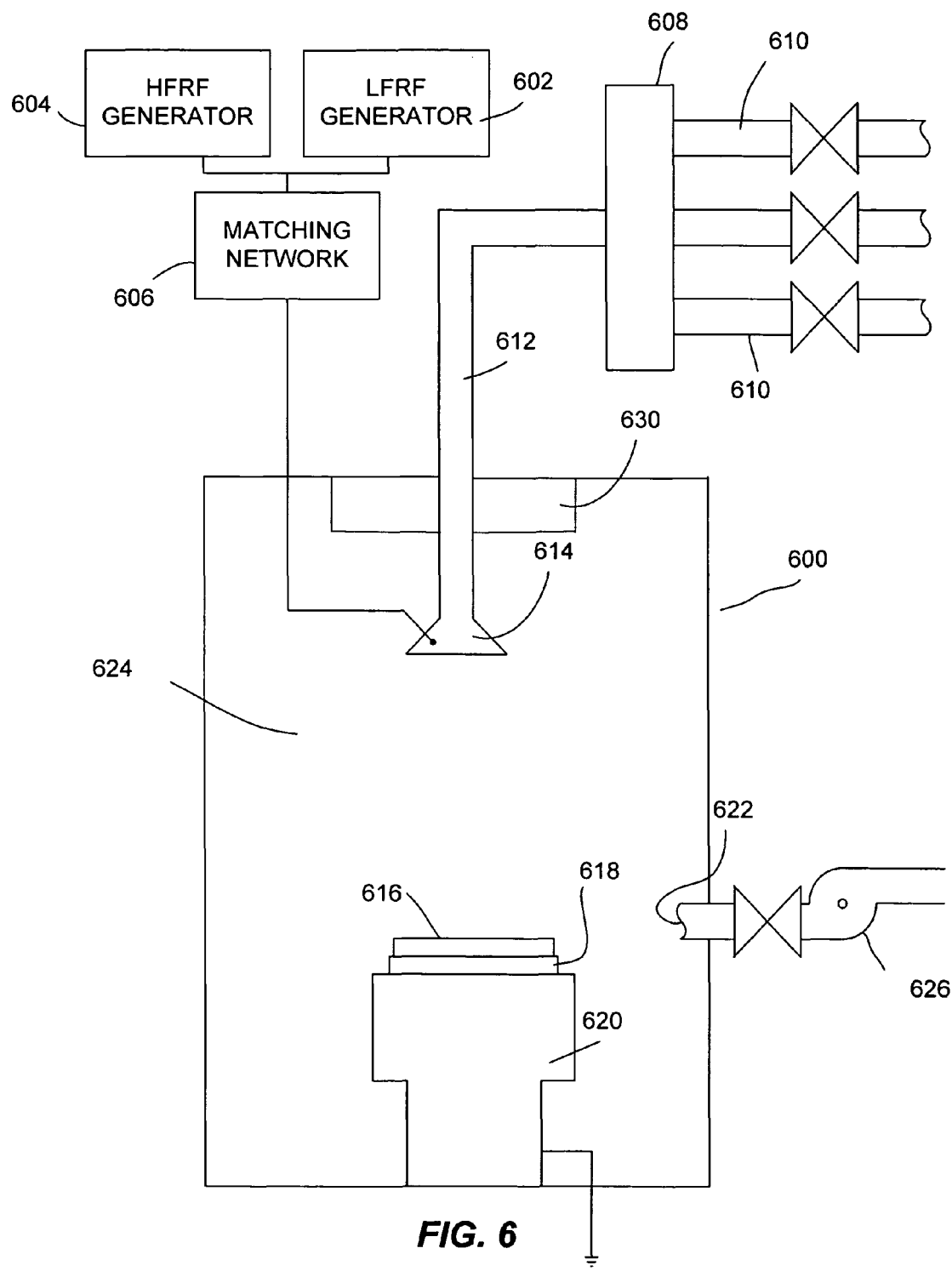
FIG. 6 is a simple block diagram depicting various reactor components arranged for implementing the deposition of dielectric films in the present invention.

FIG. 6 provides a simple block diagram depicting various reactor components arranged for implementing the present invention. As shown, a reactor 600 includes a process chamber 624, which encloses other components of the reactor and serves to contain the plasma generated by a capacitor type system including a showerhead 614 working in conjunction with a grounded heater block 620. A high-frequency RF generator 602, connected to a matching network 606, and a low-frequency RF generator 604 are connected to showerhead 614. The power and frequency supplied by matching network 606 is sufficient to generate a plasma from the process gas, for example 400-700 W total energy. In the implementation of the present invention only the HFRF generator is used. In a typical process, the high frequency RF component is generally between 2-60 MHz; in a preferred embodiment, the HF component is 13.56 MHz.

Within the reactor, a wafer pedestal 618 supports a substrate 616. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 612. Multiple source gas lines 610 are connected to manifold 608. The gases may be premixed or not. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 624 via an outlet 622. A vacuum pump 626 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

The chamber 624 may also house a UV light source 630 instead of the gas showerhead 614. The light source may be mounted outside the chamber above a window that provides the vacuum isolation. UV light source 630 may be a mercury (Hg), Xenon (Xe), or Deuterium ($D_2$) lamp or other source of UV radiation of the required characteristics, such as excimer lamps (e.g. XeCl, KrF), an in-situ or ex-situ plasma source, or a laser, e.g., an excimer laser. In a specific embodiment, the UV source is a Hg lamp that directs UV radiation on the substrate at an intensity of between 1 $\mu W/cm^2$ and 10 $W/cm^2$ in the range of 150 to 800 nanometers.

Note that the apparatus depicted in FIG. 6 is only an example of a suitable apparatus and other apparatuses designed for other methods involved in previous and/or subsequent processes may be used. For example, methods of the invention may be used with other CVD process reactors used to deposit the precursor layer if the reactor chamber is equipped with a UV radiation source. Also, it is possible to have a stand-alone UV curing system instead of it being integrated with the process chamber.

Alternate Embodiments

Figure 7:
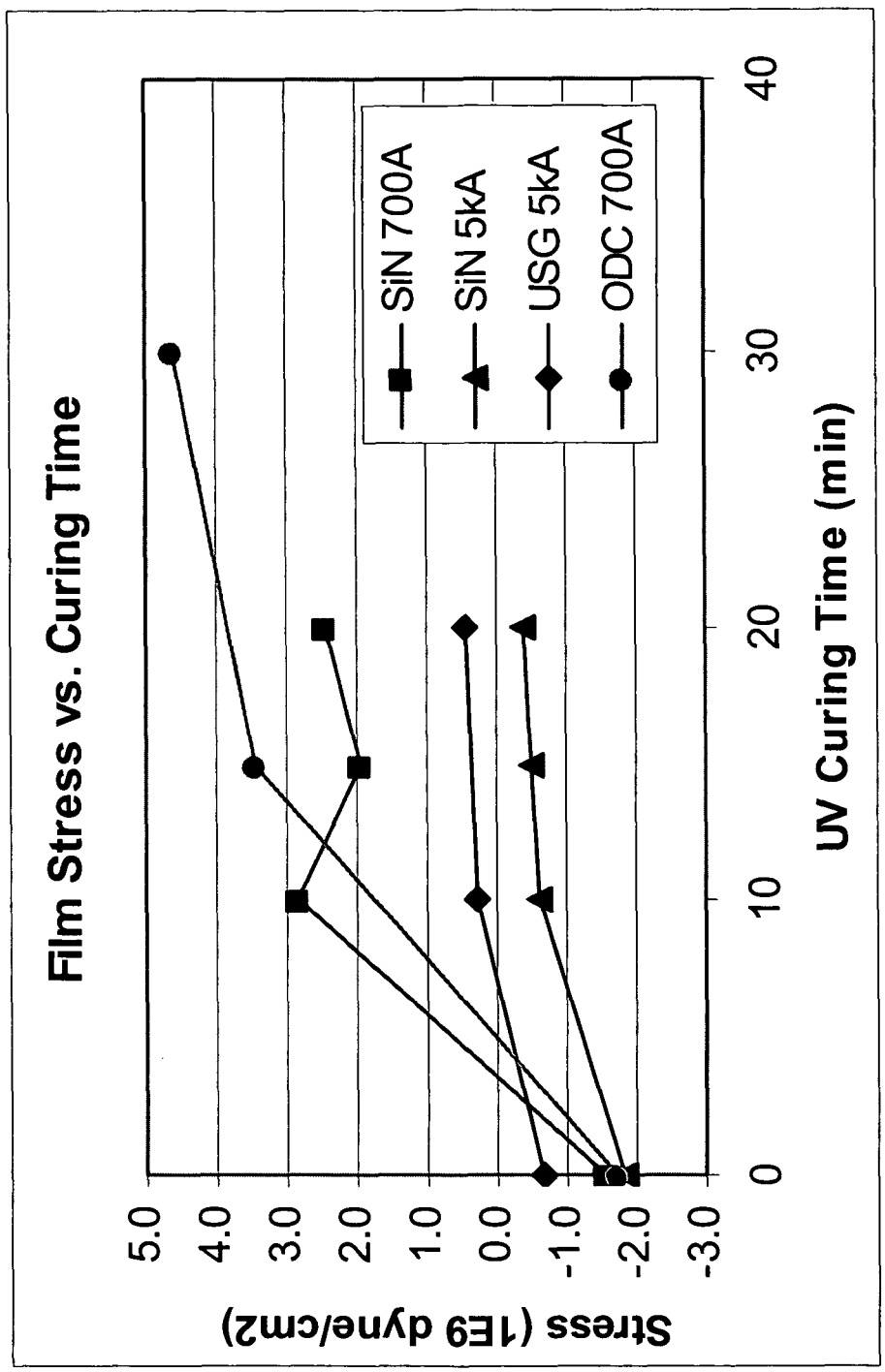
FIG. 7 is a plot of the effect of UV curing time on the stress of various PECVD dielectric films in accordance with one embodiment of the present invention.

While the invention has been primarily described and exemplified with respect to silicon nitride films herein, it is not so limited. FIG. 7 illustrates the stress changes in an unoptimized PECVD silicon nitride (SiN) (700 and 5000 Å thick), silicon oxide (un-doped silicate glass, USG) (5000 Å thick) and oxygen doped silicon carbide (ODC) (700 Å thick) after UV curing under He environment. The stress values were modulated by the curing time from as-deposited −1.57E9 dynes/$cm^2$ to 2.42E9 dynes/$cm^2$ for the 700 Å SiN after 20 minutes UV post-deposition treatment. The stress of 5000 Å USG film also changed from −6.7E8 dynes/$cm^2$ to 4.5E8 dynes/$cm^2$ after 20 minutes UV post-deposition treatment. And the oxygen doped silicon carbide film exhibited a stress change from −1.66E9 dynes/$cm^2$ to 4.61E9 dynes/$cm^2$ after 30 minutes cure. The relative FTIR SiH area changes before and after cure for the silicon carbide film are noted in Table 3, below. Accordingly, the technique of the present invention extends in principle to dielectrics other than silicon nitride, including at least silicon carbide and silicon oxide.

TABLE 3

| | As-deposited | | Post UV cured | | | |
|---|---|---|---|---|---|---|
| | | | Mean | Stress | | |
| Cure Time (min) | Film Stress (1E9 dynes/cm2) | SiH Area | Thickness Shrinkage (%) | Change after Cure (1E9 dynes/cm2) | Post Stress (1E9 dynes/cm2) | SiH Area |
| 15 | −1.75 | 1.67 | 1.83 | 5.20 | 3.45 | 1.33 |
| 30 | −1.66 | 1.63 | 3.09 | 6.27 | 4.61 | 1.15 |

It should be understood that the dielectrics may be deposited using precursors other than the silane, ammonia and nitrogen used in the described embodiment. It is also possible to introduce additives in the film, such as a porogen, with the express purpose of removing it during the UV cure to bring about film shrinkage (and correspondingly increase the tensile stress).

Also, the UV curing technique of the present invention is not limited to the single step UV exposure of a deposited film, but also applies to simultaneous UV and thermal and other treatments, or other engineered multi-step processes. For example, while it is preferable both from the perspective of process efficiency and effectiveness to deposit the dielectric to be UV cured in a single step, it is also possible to deposit and cure the dielectric in multiple repeating steps to build up a laminate dielectric with increased tensile stress and without the adverse impacts associated with thermal processing. The film stress will change with respect to the length of the treatment time, UV intensity, UV spectrum, UV operation mode such as pulse and continuous, curing environment, film thickness, and wafer curing temperature.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein.

All references cited herein are incorporated by reference for all purposes.

What is claimed is:

1. A method, comprising:
providing a substrate including a layer of a silicide;
depositing a dielectric layer directly on the layer of silicide, wherein the dielectric layer is selected from the group consisting of a silicon nitride, a silicon carbide, oxygen-doped silicon carbide, nitrogen-doped silicon carbide, silicon boron nitride, silicon boron carbide, and silicon oxide; and
exposing the dielectric layer to ultraviolet radiation at a temperature of no more than 450° C.,
whereby stress is induced in the dielectric layer.

2. The method of claim 1, wherein the dielectric layer is silicon nitride.

3. The method of claim 2, wherein the tensile stress changes in excess of 7E9 dynes/cm$^2$ in less than 10 minutes.

4. The method of claim 3, wherein the tensile stress changes in excess of 8E9 dynes/cm$^2$.

5. The method of claim 2, wherein the UV treatment is conducted at between about 250 and 450° C.

6. The method of claim 5, wherein the UV treatment is conducted at about 400° C.

7. The method of claim 6, wherein the UV treatment is conducted with an intensity of between about 1 μW/cm$^2$ and 10 W/cm$^2$ in the wavelength range of 200 to 400 nanometers.

8. The method of claim 2, wherein the deposition is conducted at between about 250 and 450° C.

9. The method of claim 8, where the deposition is conducted at about 350° C.

10. The method of claim 2, wherein the deposition is conducted by PECVD with parameters as follows:

| Parameter | Range |
|---|---|
| SiH4 (sccm) | 100-200 |
| NH3 (sccm) | 1000-4000 |
| N2 (sccm) | 5000-10000 |
| HFRF (W) | 500-1200 |

| Parameter | Range |
|---|---|
| Pressure (Torr) | 6-8 |
| Temperature (° C.) | $250 \leq X \leq 450$ |

11. The method of claim 1, wherein the dielectric layer is deposited as a single layer in a single step.

12. The method of claim 1, wherein the dielectric layer is deposited and cured in multiple repeating steps to form a laminate dielectric.

13. The method of claim 1, wherein the dielectric layer has a thickness of about 50 to 30,000 Å.

14. The method of claim 13, wherein the dielectric layer has a thickness of about 200-1500 Å.

15. The method of claim 14, wherein the dielectric layer has a thickness of about 700 Å.

16. The method of claim 1, wherein a portion of the substrate is exposed to the UV treatment such that the tensile stress of dielectric regions on the substrate is not uniform.

17. The method of claim 16, wherein a portion of the substrate is not exposed to the UV treatment.

18. The method of claim 17, wherein the UV treatment exposure of the portion is prevented by masking.

19. The method of claim 18, wherein the masking is provided in a photolithographic operation.

20. The method of claim 16, wherein portions of the substrate are exposed to varying levels of UV treatment ranging from full to none.

21. The method of claim 1, wherein the UV exposure is conducted with a UV source selected from the group consisting of a Hg lamp, a Xe lamp, a deuterium lamp, an excimer lamp, an excimer laser, and a plasma source with the desired UV radiation characteristics.

22. The method of claim 21, wherein the UV treatment is conducted with a Hg lamp as the UV source.

23. The method of claim 1, wherein the UV exposure is continuous.

24. The method of claim 1, wherein the UV exposure is pulsed.

25. The method of claim 1, wherein the UV exposure is conducted with a purging gas.

26. The method of claim 25, wherein the purging gas is selected from the group consisting of He, Ar, N$_2$, H$_2$, CO, CO$_2$, O$_2$, N$_2$O, H$_2$O vapor, vapors of alcohol, and combinations thereof.

27. The method of claim 25, wherein the purging gas is He.

28. The method of claim 1, wherein the UV exposure is conducted under a pressure in the range of about $10^{-3}$-1000 Torr.

29. The method of claim 28, wherein the UV exposure is conducted under a pressure in the range of about 1-760 Torr.

30. The method of claim 1, wherein the silicide is a salicide.

31. A method, comprising:
providing a substrate comprising a silicide;
depositing a dielectric layer on the substrate, wherein the dielectric layer is selected from the group consisting of a silicon nitride, a silicon carbide, oxygen-doped silicon carbide, nitrogen-doped silicon carbide, silicon boron nitride, silicon boron carbide, silicon oxide, and combinations thereof; and
exposing the dielectric layer to ultraviolet radiation at a temperature of no more than 450° C., whereby tensile stress in excess of 1E10 dynes/cm² is induced in the dielectric layer.

32. The method of claim 31, wherein the tensile stress is in excess of 1.5E10 dynes/cm².

33. The method of claim 31, wherein the tensile stress is in excess of 1.65E10 dynes/cm².

34. A method, comprising:

providing a substrate comprising a silicide;

depositing a dielectric layer on the substrate, wherein the dielectric layer is selected from the group consisting of silicon nitride, silicon carbide, oxygen-doped silicon carbide, nitrogen-doped silicon carbide, silicon boron nitride, silicon boron carbide, silicon oxide, and combinations thereof; and exposing the dielectric layer to ultraviolet radiation at a temperature of no more than 450° C., whereby the tensile stress in the dielectric layer changes in excess of 5E9 dynes/cm².

35. The method of claim 34, wherein the tensile stress change occurs in less than 5 minutes.

\* \* \* \* \*